United States Patent
Kotlyar et al.

(10) Patent No.: US 12,336,278 B2
(45) Date of Patent: Jun. 17, 2025

(54) GATE-ALL-AROUND INTEGRATED CIRCUIT STRUCTURES HAVING HIGH MOBILITY

(71) Applicant: Intel Corporation, Santa Clara, CA (US)

(72) Inventors: Roza Kotlyar, Portland, OR (US); Rishabh Mehandru, Portland, OR (US); Stephen Cea, Hillsboro, OR (US); Biswajeet Guha, Hillsboro, OR (US); Dax Crum, Beaverton, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 247 days.

(21) Appl. No.: 18/070,302

(22) Filed: Nov. 28, 2022

(65) Prior Publication Data

US 2023/0116170 A1    Apr. 13, 2023

Related U.S. Application Data

(63) Continuation of application No. 16/143,951, filed on Sep. 27, 2018, now Pat. No. 11,538,806.

(51) Int. Cl.
*H10D 30/62* (2025.01)
*H10D 62/10* (2025.01)
(Continued)

(52) U.S. Cl.
CPC ........... *H10D 84/853* (2025.01); *H10D 30/62* (2025.01); *H10D 62/121* (2025.01);
(Continued)

(58) Field of Classification Search
None
See application file for complete search history.

(56) References Cited

U.S. PATENT DOCUMENTS

2009/0242990 A1  10/2009  Saitoh
2011/0012176 A1  1/2011  Chidambarrao
(Continued)

FOREIGN PATENT DOCUMENTS

WO    WO 2018/039645    3/2018

OTHER PUBLICATIONS

Search Report from European Patent Application No. 19183100.7, mailed Apr. 22, 2020, 10 pgs.
(Continued)

*Primary Examiner* — Joseph C. Nicely
*Assistant Examiner* — Lamont B Koo
(74) *Attorney, Agent, or Firm* — Schwabe, Williamson & Wyatt, P.C.

(57) ABSTRACT

Gate-all-around integrated circuit structures having high mobility, and methods of fabricating gate-all-around integrated circuit structures having high mobility, are described. For example, an integrated circuit structure includes a silicon nanowire or nanoribbon. An N-type gate stack is around the silicon nanowire or nanoribbon, the N-type gate stack including a compressively stressing gate electrode. A first N-type epitaxial source or drain structure is at a first end of the silicon nanowire or nanoribbon. A second N-type epitaxial source or drain structure is at a second end of the silicon nanowire or nanoribbon. The silicon nanowire or nanoribbon has a <110> plane between the first N-type epitaxial source or drain structure and the second N-type epitaxial source or drain structure.

20 Claims, 19 Drawing Sheets

(a)

(b)

(51) Int. Cl.
  *H10D 62/13* (2025.01)
  *H10D 64/01* (2025.01)
  *H10D 64/66* (2025.01)
  *H10D 84/01* (2025.01)
  *H10D 84/03* (2025.01)
  *H10D 84/85* (2025.01)

(52) U.S. Cl.
  CPC ......... *H10D 62/151* (2025.01); *H10D 64/017* (2025.01); *H10D 64/667* (2025.01); *H10D 84/017* (2025.01); *H10D 84/0186* (2025.01); *H10D 84/0193* (2025.01); *H10D 84/038* (2025.01); *H10D 30/6219* (2025.01)

(56) References Cited

U.S. PATENT DOCUMENTS

| | | |
|---|---|---|
| 2011/0133166 A1 | 6/2011 | Bangsaruntip |
| 2012/0146053 A1 | 6/2012 | Saitoh |
| 2013/0277714 A1 | 10/2013 | Le |
| 2015/0279970 A1 | 10/2015 | Zhang |
| 2018/0047832 A1 | 2/2018 | Tapily |
| 2018/0175167 A1 | 6/2018 | Reboh |
| 2018/0277627 A1 | 9/2018 | Afzalian |

OTHER PUBLICATIONS

Office Action from European Patent Application No. 19183100.7, mailed Dec. 21, 2021, 8 pgs.

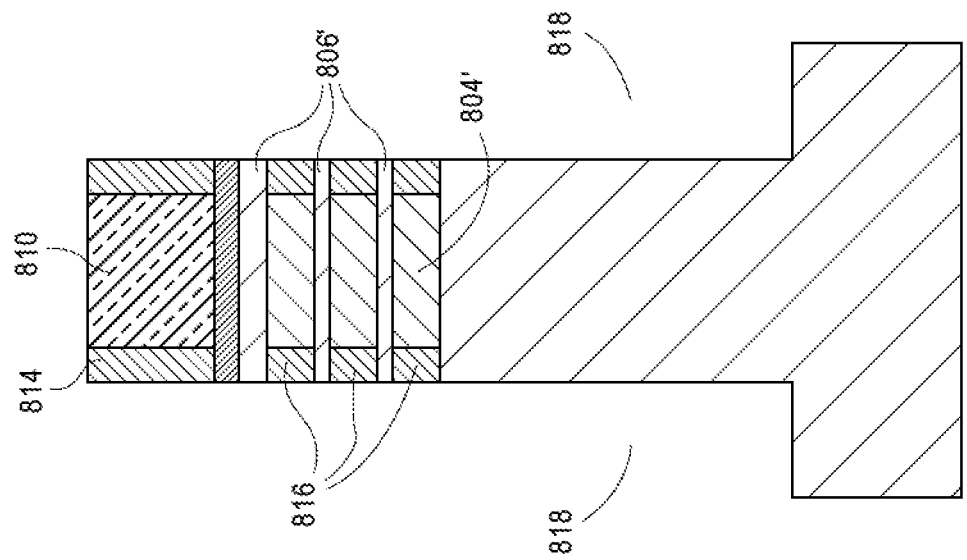
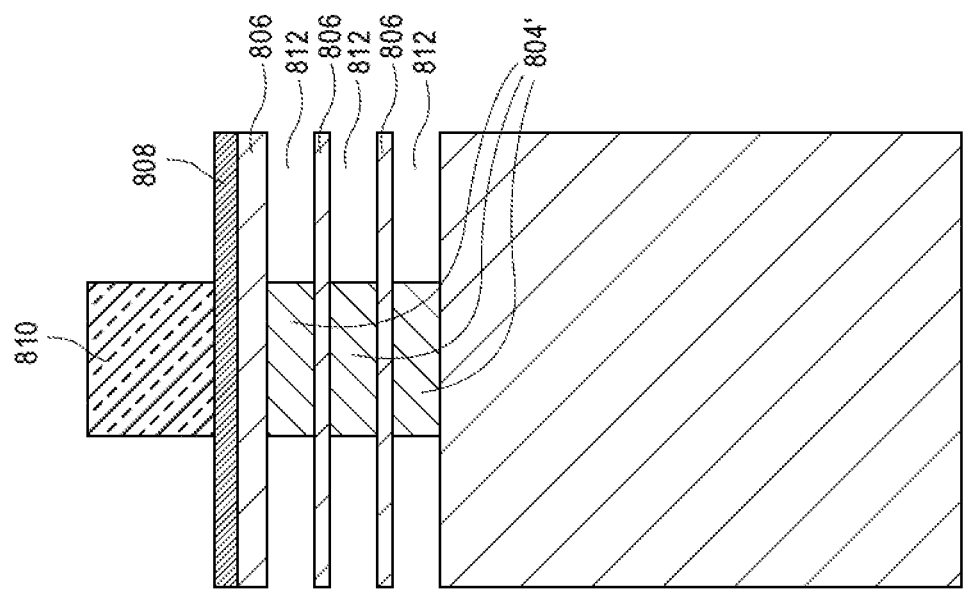

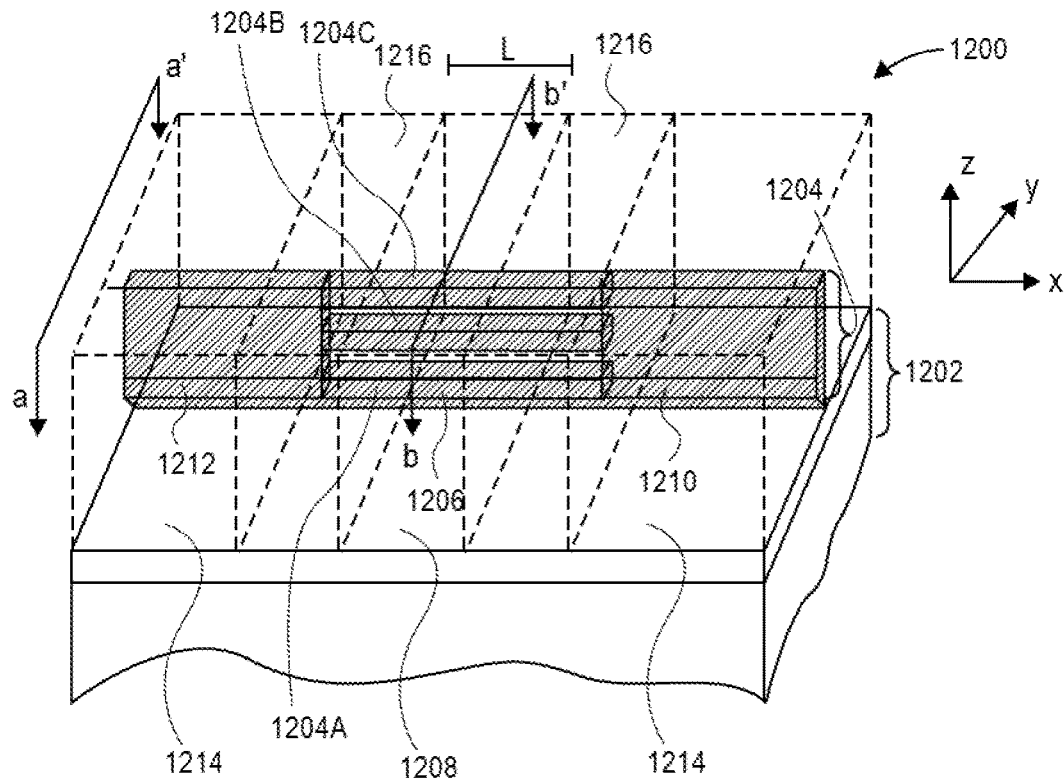
FIG. 12A
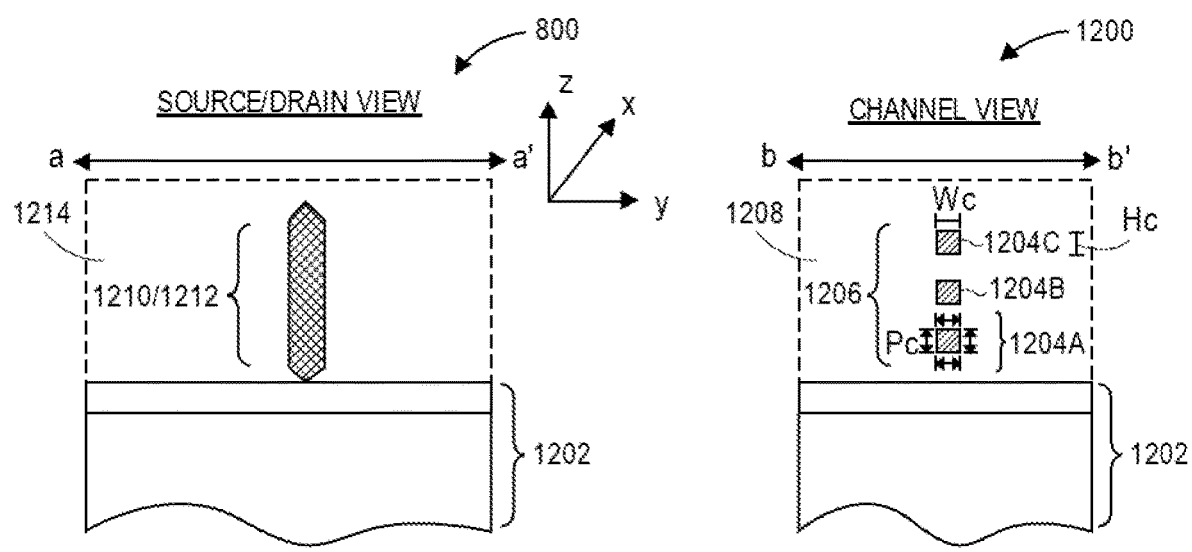
FIG. 12B  FIG. 12C

GATE-ALL-AROUND INTEGRATED CIRCUIT STRUCTURES HAVING HIGH MOBILITY

CROSS-REFERENCE TO RELATED APPLICATIONS

This application is a continuation of U.S. patent application Ser. No. 16/143,951, filed on Sep. 27, 2018, the entire contents of which is hereby incorporated by reference herein.

TECHNICAL FIELD

Embodiments of the disclosure are in the field of integrated circuit structures and processing and, in particular, gate-all-around integrated circuit structures having high mobility, and methods of fabricating gate-all-around integrated circuit structures having high mobility.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for ever-more capacity, however, is not without issue. The necessity to optimize the performance of each device becomes increasingly significant.

In the manufacture of integrated circuit devices, multi-gate transistors, such as tri-gate transistors, have become more prevalent as device dimensions continue to scale down. In conventional processes, tri-gate transistors are generally fabricated on either bulk silicon substrates or silicon-on-insulator substrates. In some instances, bulk silicon substrates are preferred due to their lower cost and because they enable a less complicated tri-gate fabrication process. In another aspect, maintaining mobility improvement and short channel control as microelectronic device dimensions scale below the 10 nanometer (nm) node provides a challenge in device fabrication. Nanowires used to fabricate devices provide improved short channel control.

Scaling multi-gate and nanowire transistors has not been without consequence, however. As the dimensions of these fundamental building blocks of microelectronic circuitry are reduced and as the sheer number of fundamental building blocks fabricated in a given region is increased, the constraints on the lithographic processes used to pattern these building blocks have become overwhelming. In particular, there may be a trade-off between the smallest dimension of a feature patterned in a semiconductor stack (the critical dimension) and the spacing between such features.

BRIEF DESCRIPTION OF THE DRAWINGS

FIGS. 8A-8J illustrates cross-sectional views of various operations in a method of fabricating a gate-all-around integrated circuit structure having high mobility, in accordance with an embodiment of the present disclosure.

FIG. 12A illustrates a three-dimensional cross-sectional view of a nanowire-based integrated circuit structure, in accordance with an embodiment of the present disclosure.

FIG. 12B illustrates a cross-sectional source or drain view of the nanowire-based integrated circuit structure of FIG. 12A, as taken along the a-a' axis, in accordance with an embodiment of the present disclosure.

FIG. 12C illustrates a cross-sectional channel view of the nanowire-based integrated circuit structure of FIG. 12A, as taken along the b-b' axis, in accordance with an embodiment of the present disclosure.

DESCRIPTION OF THE EMBODIMENTS

Figure 1:
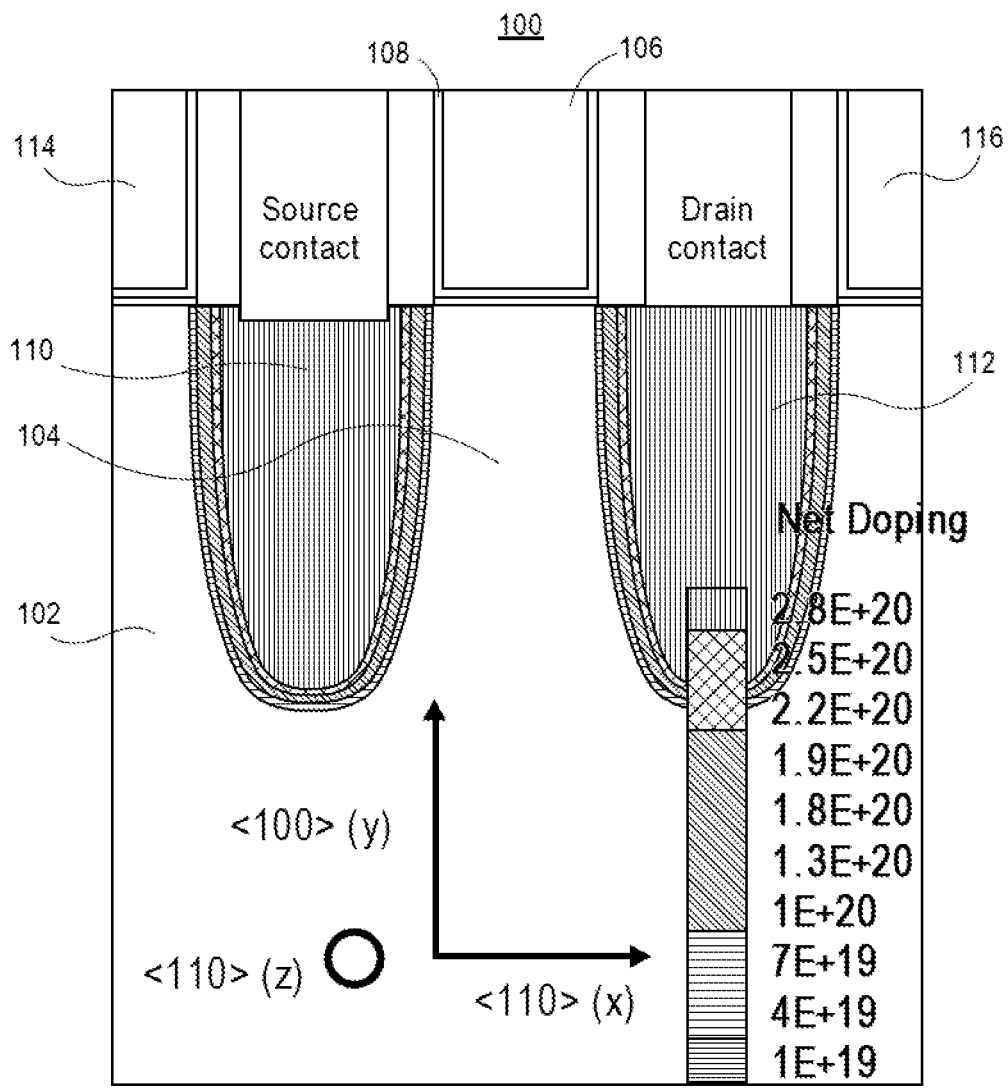
FIG. 1 illustrates a cross-sectional view of a state-of-the-art tri-gate device fabricated on a (100) wafer with source-drain direction along a <110> notch.

Gate-all-around integrated circuit structures having high mobility, and methods of fabricating gate-all-around integrated circuit structures having high mobility, are described. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments described herein are directed to improving NMOS performance in nanowires and nanoribbons by using compressive metal gate stress and (110) wafer orientation. Embodiments may be implemented to provide a path to transfer stress from a gate material to NMOS nanowire transistors, which can enhance channel mobility and device performance.

To provide context, tensile metal gate electrodes have been implemented for NMOS tri-gate structures fabricated on a (100) wafer with a <110> notch to boost electron channel mobility for device performance improvement. One potential drawback is that tensile metal gate stress may not be transferred effectively for performance gains in gate-all-around (GAA) nanowire (NW) structures fabricated on (100) wafers with <110> notches.

In accordance with one or more embodiments described herein, a (110) wafer is used in conjunction with a compressive metal gate electrode to boost gate-all-around nanowire device performance, in particular for NMOS device performance. In an embodiment, a combination of (110) wafer, compressive metal and along channel stress sources is implemented to further boost GAA device performance. Embodiments described herein may be implemented to take advantage of metal gate stressors to boost the performance of the nanowires.

To provide further context, gate-all-around (GAA) nanoribbons (NR) and nanowires (NW) may enable further MOSFET scaling due to superior short channel effects over (100) tri-gates. FIG. 1 illustrates a cross-sectional view of a state-of-the-art tri-gate device fabricated on a (100) wafer with source-drain direction along a <110> notch.

Referring to FIG. 1, a tri-gate structure 100 includes a fin 102 having a channel region 104. A metal gate electrode 106 and associated gate dielectric layer 108 are over the channel region 104. A first source or drain structure 110 and a second source or drain structure 112 are at first and second ends of the channel region 104, respectively, at first and second sides of the metal gate electrode 106, respectively. First 114 and second 116 contacts are associated with the first source or drain structure 110 and the second source or drain structure 112, respectively. The source-drain direction is along <110> notch (x-axis in FIG. 1), the tri-gate width direction is along <110> direction (z-axis in FIG. 1, normal to the plane of view), and the tri-gate height direction is along <100> direction (y-axis in FIG. 1). The current in tri-gate is pre-dominantly conducted by electrons on tri-gate sidewalls which have (110) surface orientation.

Figure 2:
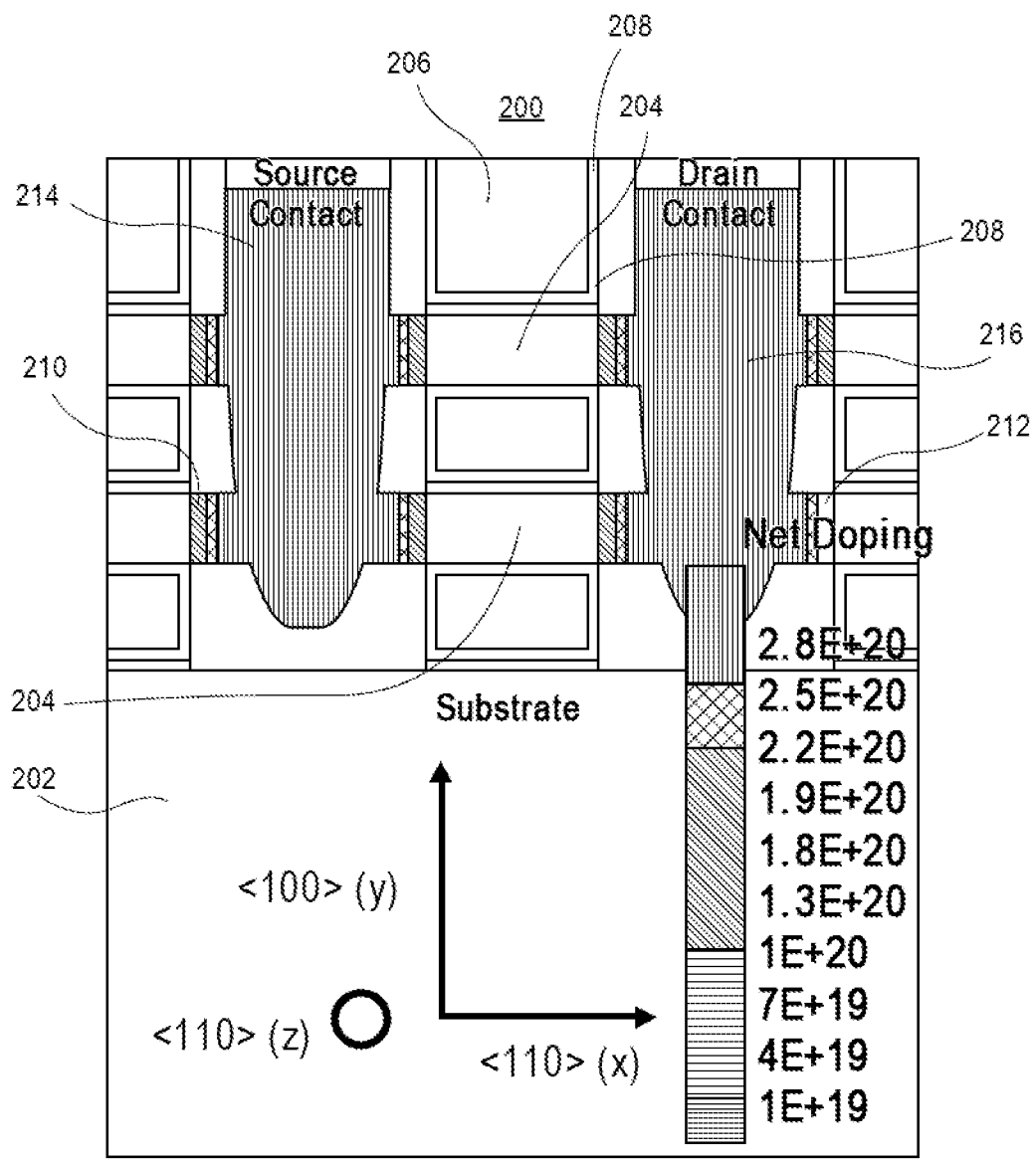
FIG. 2 illustrates a cross-sectional view of a state-of-the-art nanowire structure with two nanowire channels fabricated on a (100) wafer with source-drain direction along a <110> notch.

It is to be appreciated that horizontal nanoribbons have cross-sections with a width dimension being larger than the height, while nanowires have comparable width and height dimensions. FIG. 2 illustrates a cross-sectional view of a state-of-the-art nanowire structure with two nanowire channels fabricated on a (100) wafer with source-drain direction along a <110> notch.

Referring to FIG. 2, a nanowire structure 200 includes nanowires 204 above a substrate 202. A metal gate electrode 206 and associated gate dielectric layer 208 are around the nanowires 204. A first source or drain structure 210 and a second source or drain structure 212 are at first and second ends of the nanowires 204, respectively, at first and second sides of the metal gate electrode 206, respectively. First 214 and second 216 contacts are associated with the first source or drain structure 210 and the second source or drain structure 212, respectively. The source-drain direction is along <110> notch (x-axis in FIG. 2), the wire width direction is along <110> direction (z-axis in FIG. 2, normal to the plane of view), and the wire height direction is along <100> direction (y-axis in FIG. 2).

Figure 3:
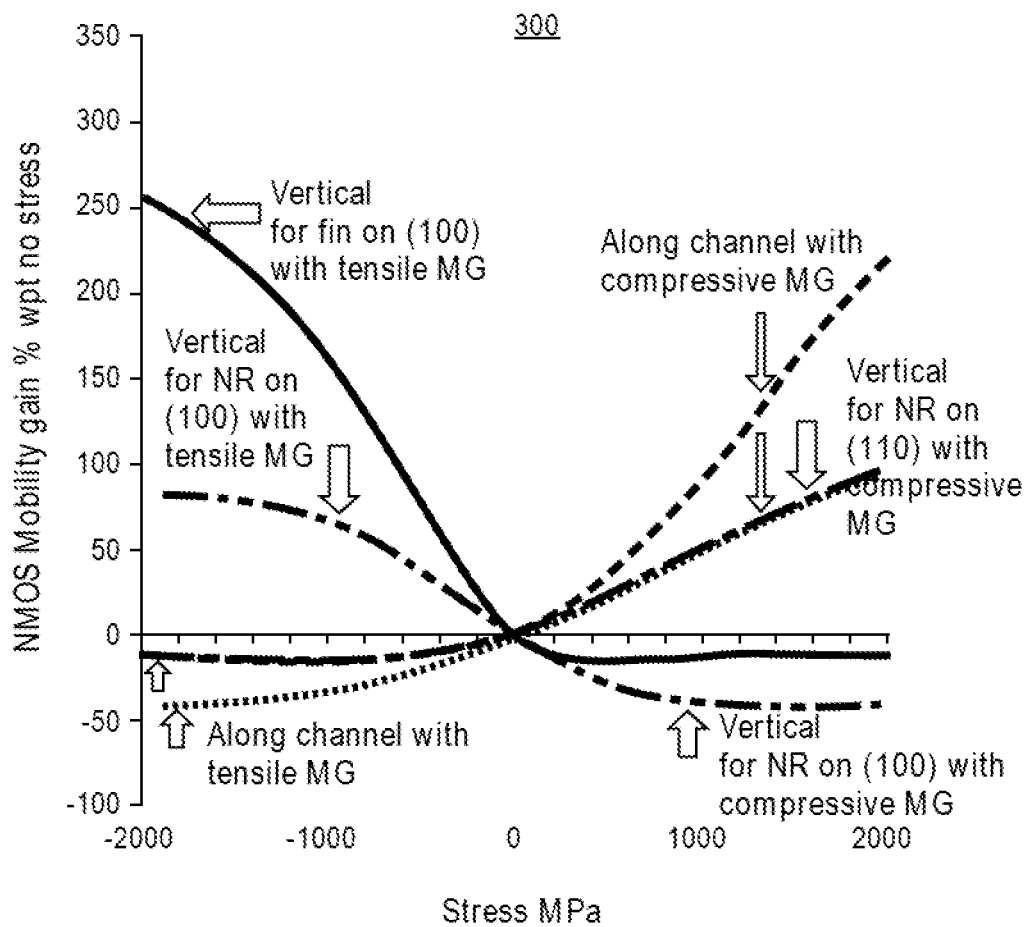
FIG. 3 is a plot 300 of NMOS mobility gain % wpt no stress as a function of stress (MPa), for an NMOS tri-gate structure.

To provide further context, stressors have been implemented as performance boosters for tri-gate structures. Use of a metal gate material with intrinsic tensile metal gate stress in NMOS provides a compressive vertical stress along a <100> y-axis and provides a compressive negative stress along a transport source-drain direction <110> x-axis which are transferred to a silicon (Si) channel in a state-of-the art tri-gate structure. The compressive vertical stress may enhance tri-gate sidewall electron mobility, and the compressive negative stress along a transport direction may degrade the tri-gate sidewall electron mobility. FIG. 3 is a plot 300 of NMOS mobility gain % wpt no stress as a function of stress (MPa), for an NMOS tri-gate structure.

Referring to plot 300 of FIG. 3, the stress sensitivity to various stress directions are shown. The vertical stress is the largest stress component transferred from tensile metal gate and results in the enhancement of electron mobility and NMOS tri-gate performance.

Figure 4:
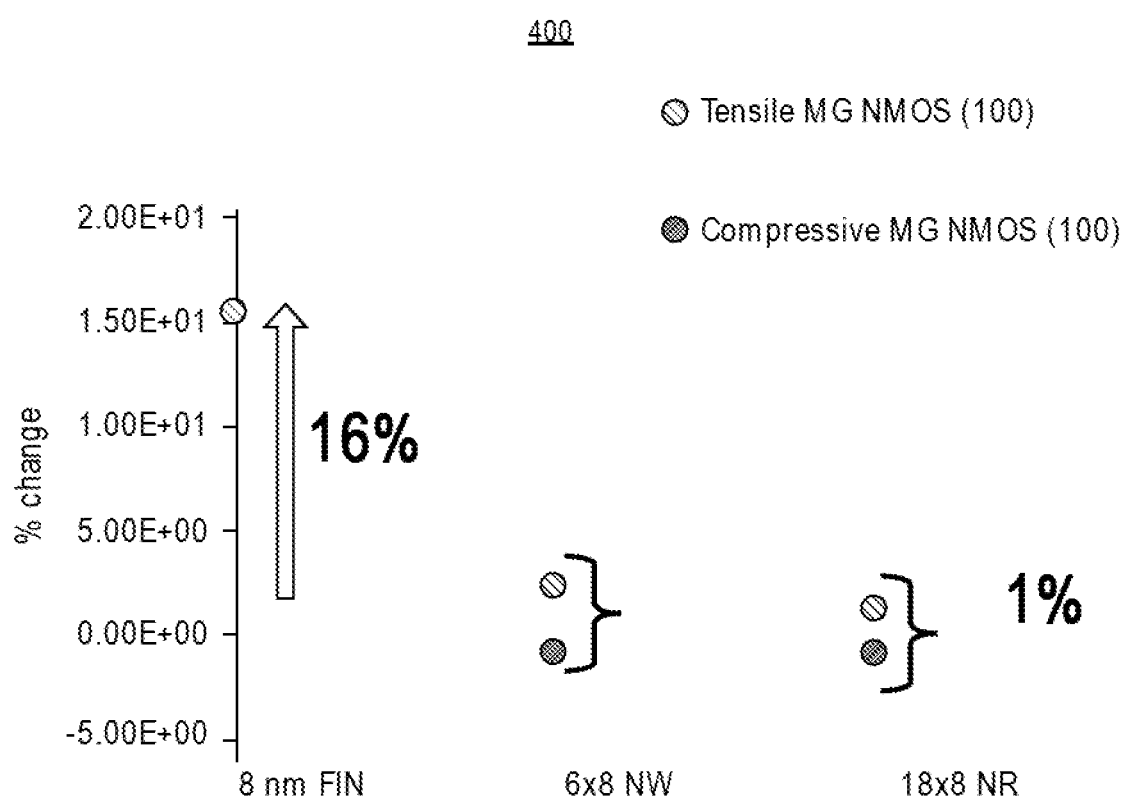
FIG. 4 is a plot 400 of % change as a function of structure (fin, nanowire (NW), or nanoribbon (NR)).

Stress sensitivities of electron mobility to stress transferred to the device channel from metal gate material with tensile or compressive intrinsic stress. For example, using 1211 MPa tensile stress in state-of-the art NMOS tri-gate leads to 16% NMOS Beta gain. FIG. 4 is a plot 400 of % change as a function of structure (fin, nanowire (NW), or nanoribbon (NR).

Referring to plot 400 of FIG. 4, Beta is a simulated performance metric. Stress transfer to channel from a 1211 MPa tensile metal gate boosts performance in simulated state-of-the art NMOS tri-gate with width of 8 nm by 16%, whereas the stress transfer is not effective to obtain equivalent gains in simulated 18 nm (z) by 8 nm (y) nanoribbon or 6 nm (z) by 8 nm (y) nanowire devices. As such, the advantage of tensile metal gate stressor may be diminished or essentially may not present for NMOS nanowire devices fabricated on (100) wafers. On a (100) wafer, the metal gate stress may not be transferred effectively for performance gains in GAA structures. For example, the impact of metal gate stress is in the range from −1% to 2.5% for NW, and −1% to 1.4% for NR as simulated in FIG. 4.

Not to be bound by theory, the reduced sensitivity of nanowire device response to a metal gate stressor is best understood as being a consequence of both the change of orientation of transport plane relative to the orientation of channel stresses, and due to the reduction of the stress transferred from the metal gate. For GAA devices, there are no equivalent free surfaces along the device perimeter present to impart equivalent stress from a metal gate to NR or NW channel as compared to a tri-gate structure. Additionally, the metal gate relaxes stress to free surfaces in regions separating NR or NW multiple wire channels. As a result, the vertical stress component may be reduced in GAA as compared to tri-gates.

For horizontal nanoribbons, the compressive vertical stress transferred from the metal gate is normal to the transport plane in nanoribbon which is (100). For this plane, the transport gains due to vertical stress are reduced compared to gains for tri-gate sidewalls, as simulated in FIG. 3. In accordance with an embodiment of the present disclosure, a compressive metal gate material and (110) wafer orientation is implemented to impart tensile channel stress along a <110> transport direction and tensile vertical stress along a <110> direction to enhance nanowire performance. As an example, FIG. 5 illustrates a cross-sectional view of a nanowire structure with two nanowire channels fabricated on a (110) wafer with source-drain direction along a <110> notch, in accordance with an embodiment of the present disclosure.

Figure 5:
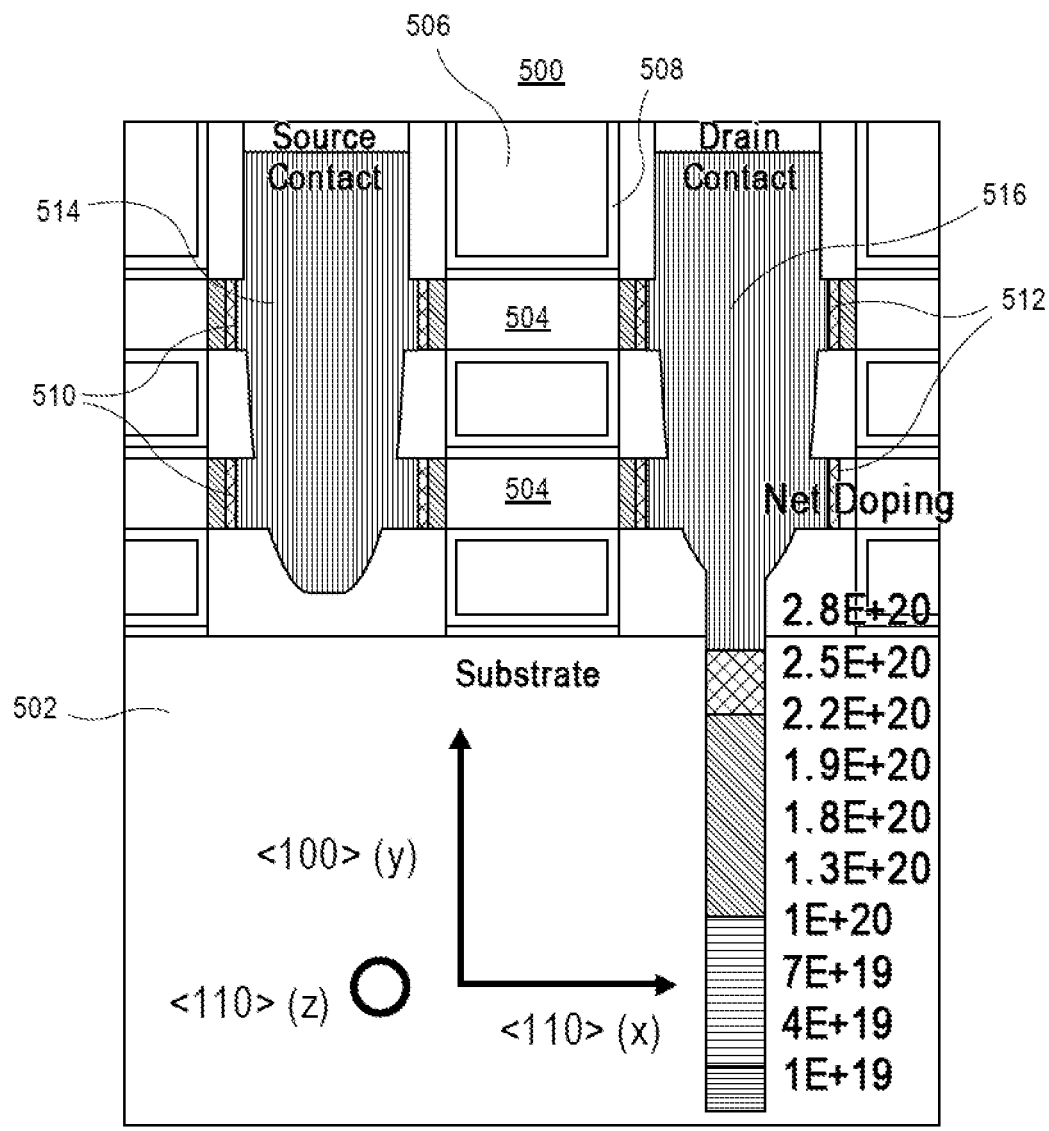
FIG. 5 illustrates a cross-sectional view of a nanowire structure with two nanowire channels fabricated on a (110) wafer with source-drain direction along a <110> notch, in accordance with an embodiment of the present disclosure.

Referring to FIG. 5, a nanowire structure 500 includes nanowires 504 above a substrate 502. A compressive metal gate electrode 506 and associated gate dielectric layer 508 are around the nanowires 504. A first source or drain structure 510 and a second source or drain structure 512 are at first and second ends of the nanowires 504, respectively, at first and second sides of the metal gate electrode 506, respectively. First 514 and second 516 contacts are associated with the first source or drain structure 510 and the second source or drain structure 512, respectively. The source-drain direction is along <110> notch (x-axis in FIG. 5), the wire width direction is along <100> direction (z-axis in FIG. 5, normal to the plane of view), the wire height direction is along <110> direction (y-axis in FIG. 5). A material with compressive intrinsic stress is used as gate electrode material.

To provide comparative context, referring again to plot 300 of FIG. 3, compressive metal gate imparts tensile stress along a channel which provides gain for an NMOS nanowire channel with a larger response than for nanowires fabricated on (100) wafer orientation. Compressive metal gate imparts tensile vertical along gate stack growth direction stress which gives gain for nanowire, whereas this direction of stress leads to loss for nanowires fabricated on (100) wafer orientation.

In summary, in accordance with embodiments of the present disclosure, stresses are imparted on nanowire or nanoribbon channels from a compressive metal gate. For comparison, for nanowires fabricated on a (100) wafer, such channel stress may improve NMOS mobility, but vertical stress degrades NMOS mobility. However, in accordance with an embodiment of the present disclosure, for nanowires fabricated on a (110) wafer, both the channel and vertical stress transferred from a compressive gate improve NMOS mobility. Such improvement may be due to a channel stress that is stronger and, as a result, in an embodiment, implementation of compressive metal gate and (110) wafer orientation improves performance of nanowires, and in particular NMOS devices includes such nanowires.

Figure 6:
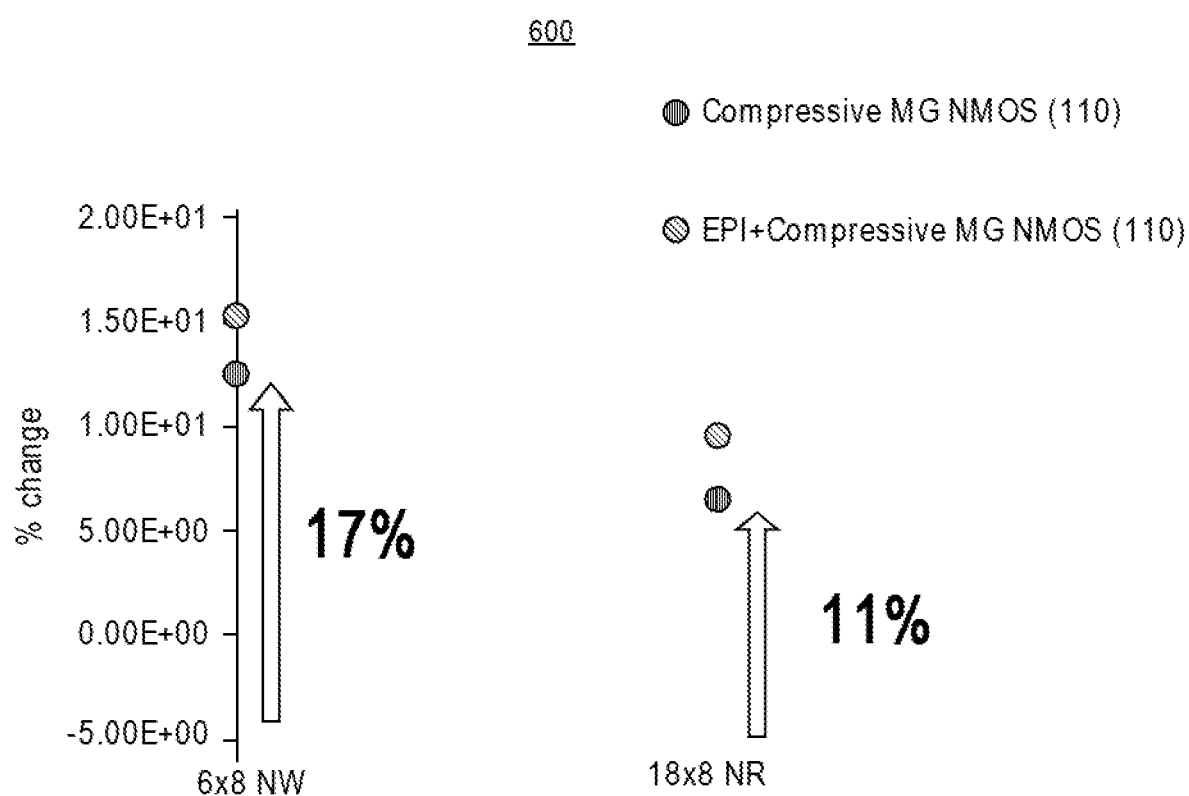
FIG. 6 is a plot of percent (%) change as a function of structure (nanowire (NW), or nanoribbon (NR)), in accordance with an embodiment of the present disclosure.

In an exemplary embodiment, FIG. 6 is a plot 600 of percent (%) change as a function of structure (nanowire (NW), or nanoribbon (NR), in accordance with an embodiment of the present disclosure. Referring to plot 600 of FIG. 6, a 1211 MPa compressive metal gate is simulated to give 17% and 11% Beta gains on nanowires and on nanoribbons with <110> notch source-drain direction fabricated on (110). Stress transfer to channel from 1211 MPa compressive metal gate boosts performance in simulated 18 nm (z) by 8 nm (y) nanoribbon or 6 nm (z) by 8 nm (y) nanowire devices fabricated on (110) wafers. In an embodiment, the advantage of compressive metal gate stressor is demonstrated with simulation of NMOS nanowire devices fabricated on (110) wafers.

Embodiments of the present disclosure may combine the gains from a combination of stressors for further maximizing the performance gains of NMOS nanowire transistors by using a compressive metal gate stressor and along-channel stressors. As an example of channel stressor, a stress due to dopants in source/drain epi regions can be used. For example, the use of phosporus dopants in epitaxial source or drain regions results in the stress along the channel. As an example, FIG. 7 illustrates a cross-sectional view of a nanowire structure with two nanowire channels fabricated on a (110) wafer with source-drain direction along a <110> notch and with an added tensile along-the-channel stressor, in accordance with an embodiment of the present disclosure.

Figure 7:
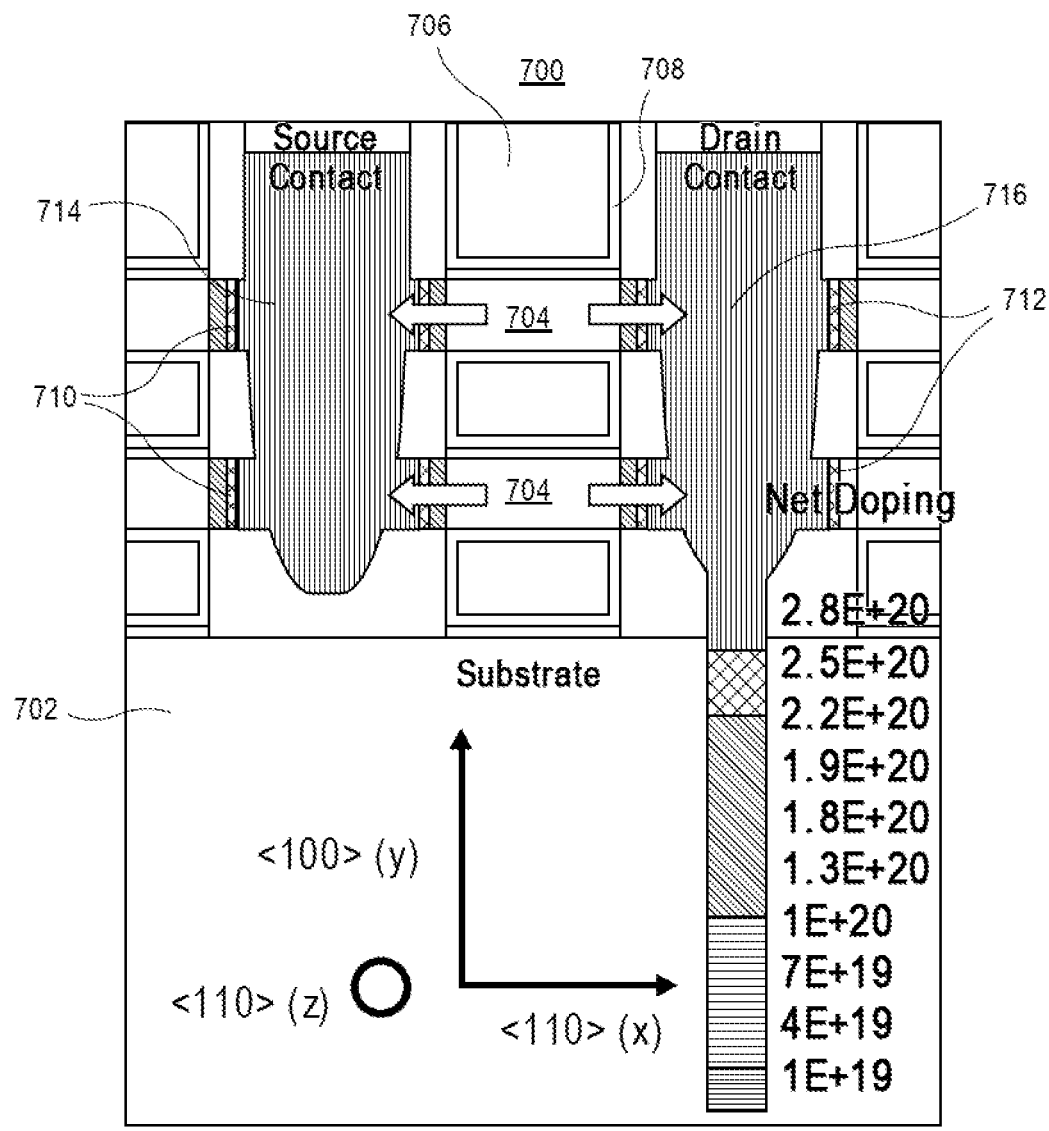
FIG. 7 illustrates a cross-sectional view of a nanowire structure with two nanowire channels fabricated on a (110) wafer with source-drain direction along a <110> notch and with an added tensile along-the-channel stressor, in accordance with an embodiment of the present disclosure.

Referring to FIG. 7, a nanowire structure 700 includes nanowires 704 above a substrate 702, such as a fin portion of a substrate. A compressive metal gate electrode 706 and associated gate dielectric layer 708 are around the nanowires 704. A first source or drain structure 710 and a second source or drain structure 712 are at first and second ends of the nanowires 704, respectively, at first and second sides of the metal gate electrode 706, respectively. First 714 and second 716 contacts are associated with the first source or drain structure 710 and the second source or drain structure 712, respectively. In an embodiment, the tensile along-the-channel stressor is added for further maximizing NMOS nanowire performance. In a particular embodiment, the along-the-channel stress is a tensile stress (as shown with the arrows) results from using Phosphorus (P) dopant atoms in silicon (Si) source or drain epitaxial structures.

In accordance with an embodiment of the present disclosure, channel stress due to Phosphorus atoms incorporated in a source or drain epitaxial structure is used in combination with compressive metal gate stressors to increase further beta gains for NMOS nanowires fabricated on (110) wafers.

To manufacture such a stack, a nanowire device may be fabricated on a (110) wafer, with a gate fill operation used to fill the gate at a replacement metal gate operation. Alternatively, a subtractive metal gate operation may be performed with metal gate materials with the intrinsic compressive metal gates, such as, for example, TiN, thin Cr layers, Al, V, Zr, Nb, any of which may be sputtered at low pressure.

With reference again to FIG. 7 (or corresponding features of FIG. 5), in an embodiment, an integrated circuit structure 700 includes a vertical arrangement of silicon nanowires 704 above a fin 702. An N-type gate stack 706 is around the vertical arrangement of silicon nanowires 704. The N-type gate stack 706 includes a compressively stressing gate electrode. A first N-type epitaxial source or drain structure 710 is at a first end of the vertical arrangement of silicon nanowires 704. A second N-type epitaxial source or drain structure 712 is at a second end of the vertical arrangement of silicon nanowires 704. The vertical arrangement of silicon nanowires 704 has a <110> plane between the first N-type epitaxial source or drain structure 710 and the second N-type epitaxial source or drain structure 712.

In an embodiment, the N-type gate stack 706 includes a conductive layer including a material selected from the group consisting of TiN, Cr, Al, V, Zr, and Nb. In an embodiment, the N-type gate stack 706 includes a high-k gate dielectric layer 708. In an embodiment, the fin 702 is a silicon fin.

In an embodiment, the first 710 and second 712 N-type epitaxial source or drain structures are discrete first and second N-type epitaxial source or drain structures, an example of which is illustrated in FIGS. 8F-8J. In an embodiment, the first 710 and second 712 N-type epitaxial source or drain structures are non-discrete first and second epitaxial N-type source or drain structures, an example of which is illustrated in FIGS. 12A and 12B. In an embodiment, first N-type epitaxial source or drain structure 710 and the second N-type epitaxial source or drain structure 712 include phosphorous dopant impurity atoms. In a specific such embodiment, the first N-type epitaxial source or drain structure 710 and the second N-type epitaxial source or drain structure 712 are predominantly epitaxial silicon structures which include the phosphorous dopant impurity atoms therein.

In another aspect, backend (BE) interconnect scaling can result in lower performance and higher manufacturing cost due to patterning complexity. Embodiments described herein may be implemented to enable front and backside interconnect integration for nanowire transistors. Embodiments described herein may provide an approach to achieve a relatively wider interconnect pitch. The result may be improved product performance and lower patterning costs. Embodiments may be implemented to enable robust functionality of scaled nanowire or nanoribbon transistors with low power and high performance.

One or more embodiments described herein are directed dual epitaxial (EPI) connections for nanowire or nanoribbon transistors using partial source or drain (SD) and asymmetric trench contact (TCN) depth. In an embodiment, an integrated circuit structure is fabricated by forming source-drain openings of nanowire/nanoribbon transistors which are partially filled with SD epitaxy. A remainder of the opening is filled with a conductive material. Deep trench formation on one of the source or drain side enables direct contact to a backside interconnect level.

In an exemplary process flow, FIGS. 8A-8J illustrates cross-sectional views of various operations in a method of fabricating a gate-all-around integrated circuit structure having high mobility, in accordance with an embodiment of the present disclosure.

Figure 8B:
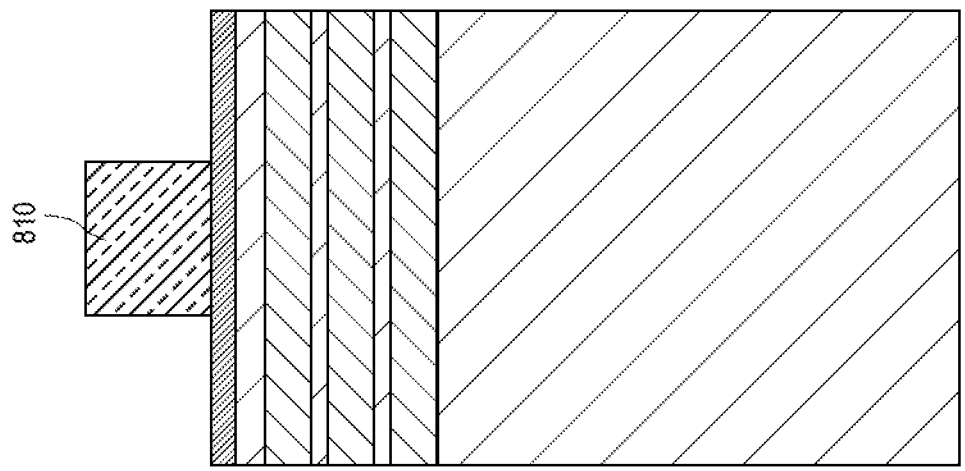
Figure 8A:
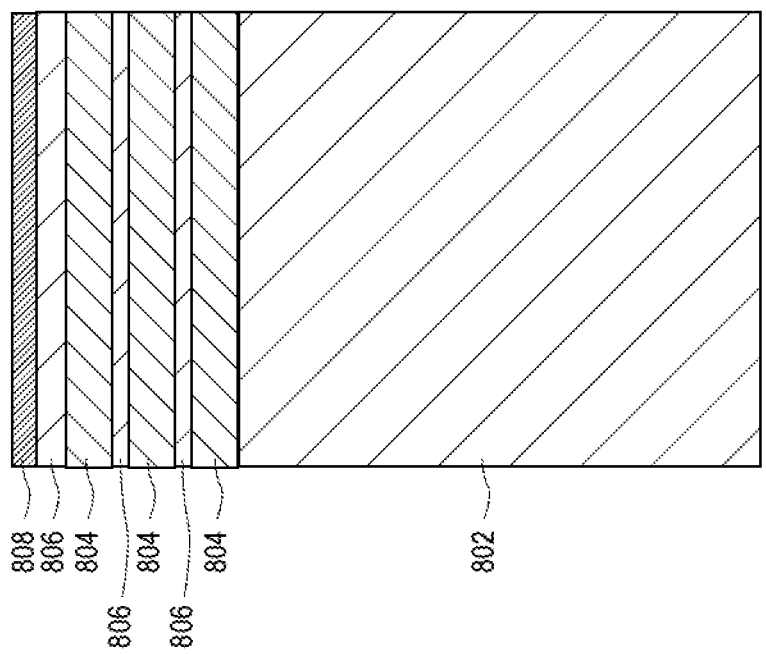

Referring to FIG. 8A, a method of fabricating an integrated circuit structure includes forming a starting stack which includes alternating silicon germanium layer 804 and silicon layers 806 above a fin 802, such as a silicon fin. The silicon layers 806 may be referred to as a vertical arrangement of silicon nanowires. A protective cap 808 may be formed above the alternating silicon germanium layer 804 and silicon layers 806, as is depicted.

Referring to FIG. 8B, a gate stack 810 is formed over the vertical arrangement of nanowires 806. Portions of the vertical arrangement of nanowires 806 are then released by removing portions of the silicon germanium layer 804 to provide recessed silicon germanium layers 804' and cavities 812, as is depicted in FIG. 8C.

It is to be appreciated that the structure of FIG. 8C may be fabricated to completion without first performing the deep etch and asymmetric contact processing described below. In either case (e.g., with or without asymmetric contact processing), in an embodiment, the resulting structure is fabricated using a (110) wafer with a <110> transport direction between source and drain structures.

Figure 8G:
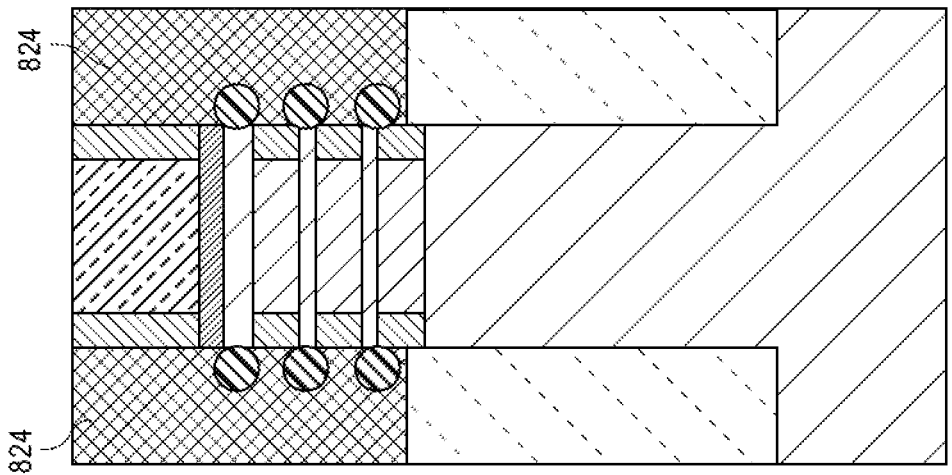

Referring to FIG. 8D, upper gate spacers 814 are formed at sidewalls of the gate structure 810. Cavity spacers 816 are formed in the cavities 812 beneath the upper gate spacers 814. A deep trench contact etch is then performed to form trenches 818 and to formed recessed nanowires 806'. A sacrificial material 820 is then formed in the trenches 818, as is depicted in FIG. 8E.

Figure 8F:
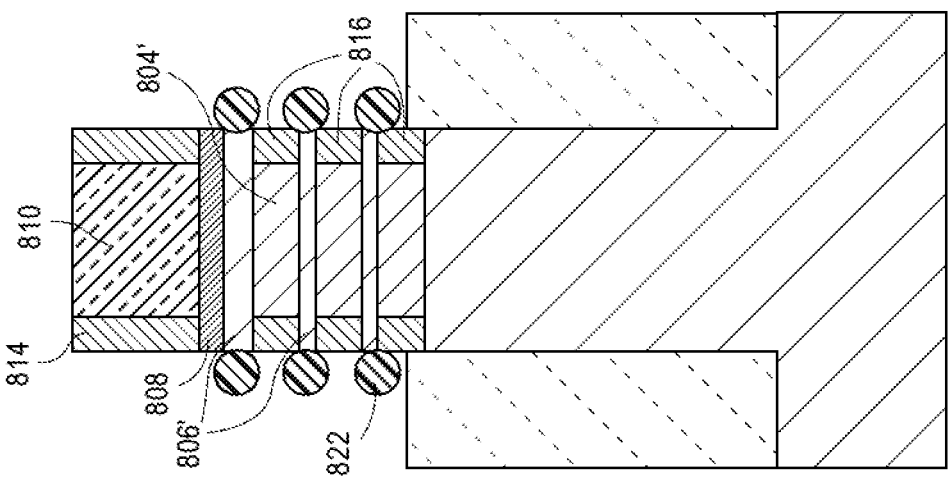
Figure 8E:
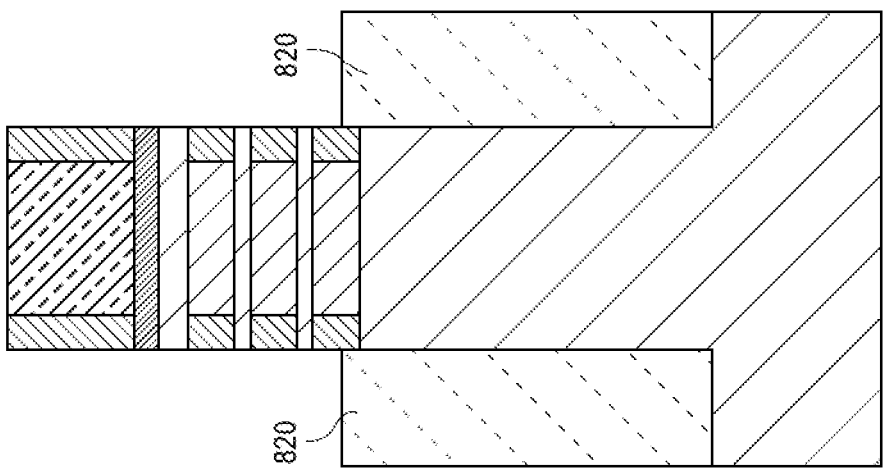

Referring to FIG. 8F, a first epitaxial source or drain structure (e.g., left-hand features 822) is formed at a first end of the vertical arrangement of nanowires 806'. A second epitaxial source or drain structure (e.g., right-hand features 822) is formed at a second end of the vertical arrangement of nanowires 806'. An inter-layer dielectric (ILD) material 824 is then formed at the sides of the gate electrode 810 and adjacent the source or drain structures 822, as is depicted in FIG. 8G.

Figure 8J:
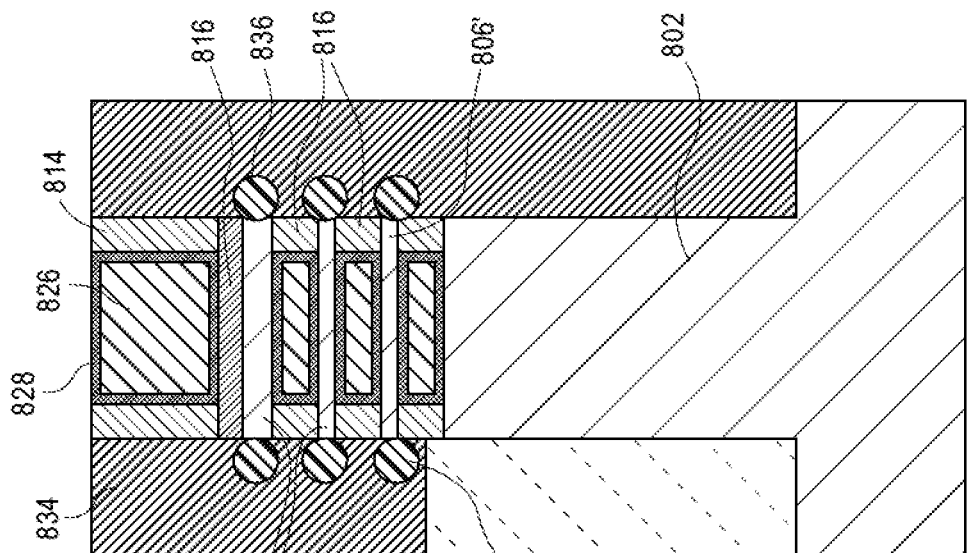
Figure 8I:
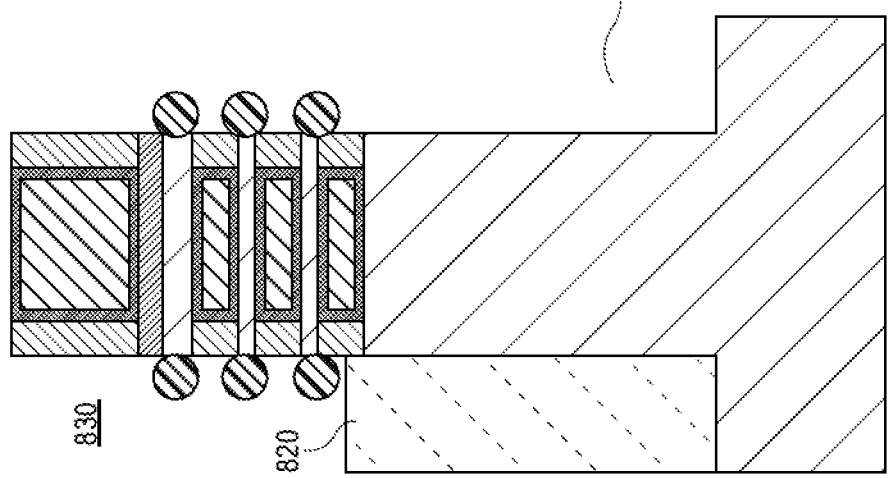
Figure 8H:
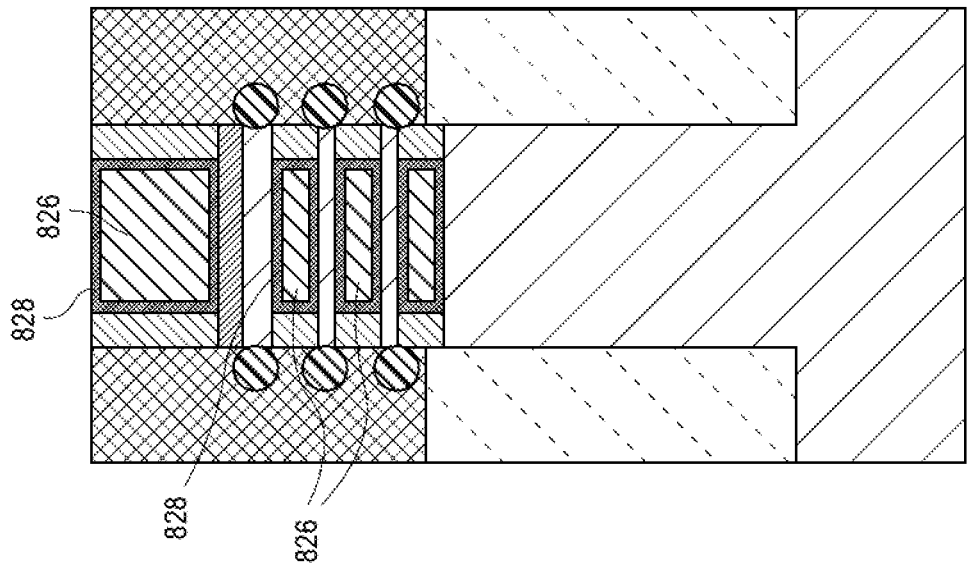

Referring to FIG. 8H, a replacement gate process is used to form a permanent gate dielectric 828 and a permanent gate electrode 826. The ILD material 824 is then removed. The sacrificial material 820 is then removed from one of the source drain locations (e.g., right-hand side) to form trench 832, but is not removed from the other of the source drain locations to form trench 830, as is depicted in FIG. 8I.

In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, the permanent gate electrode 826 is an N-type gate stack including a compressively stressing gate electrode. In one embodiment, the first epitaxial source or drain structure (e.g., left-hand features 822) and the second epitaxial source or drain structure (e.g., right-hand features 822) are a first N-type epitaxial source or drain structure and a second N-type epitaxial source or drain structure, respectively, both including phosphorous dopant impurity atoms.

Referring to FIG. 8J, a first conductive contact structure 834 is formed coupled to the first epitaxial source or drain structure (e.g., left-hand features 822). A second conductive contact structure 836 is formed coupled to the second epitaxial source or drain structure (e.g., right-hand features 822). The second conductive contact structure 836 is formed deeper along the fin 802 than the first conductive contact structure 834. In an embodiment, although not depicted in FIG. 8J, the method further includes forming an exposed surface of the second conductive contact structure 836 at a bottom of the fin 802.

In an embodiment, the second conductive contact structure 836 is deeper along the fin 802 than the first conductive contact structure 834, as is depicted. In an embodiment, the second conductive contact structure 836 is deeper along the fin 802 than the first conductive contact structure 834, as is depicted. In one such embodiment, the first conductive contact structure 834 is not along the fin 802, as is depicted. In another such embodiment, not depicted, the first conductive contact structure 834 is partially along the fin 802.

In an embodiment, the second conductive contact structure 834 is along an entirety of the fin 802. In an embodiment, although not depicted, in the case that the bottom of the fin 802 is exposed by a backside substrate removal process, the second conductive contact structure 834 has an exposed surface at a bottom of the fin 802.

In another aspect, in order to enable access to both conductive contact structures of a pair of asymmetric source and drain contact structures, integrated circuit structures described herein may be fabricated using a back-side reveal of front-side structures fabrication approach. In some exemplary embodiments, reveal of the back-side of a transistor or other device structure entails wafer-level back-side processing. In contrast to a conventional TSV-type technology, a reveal of the back-side of a transistor as described herein may be performed at the density of the device cells, and even within sub-regions of a device. Furthermore, such a reveal of the back-side of a transistor may be performed to remove substantially all of a donor substrate upon which a device layer was disposed during front-side device processing. As such, a microns-deep TSV becomes unnecessary with the thickness of semiconductor in the device cells following a reveal of the back-side of a transistor potentially being only tens or hundreds of nanometers.

Reveal techniques described herein may enable a paradigm shift from "bottom-up" device fabrication to "center-out" fabrication, where the "center" is any layer that is employed in front-side fabrication, revealed from the back side, and again employed in back-side fabrication. Processing of both a front side and revealed back side of a device structure may address many of the challenges associated with fabricating 3D ICs when primarily relying on front-side processing.

A reveal of the back-side of a transistor approach may be employed for example to remove at least a portion of a carrier layer and intervening layer of a donor-host substrate assembly. The process flow begins with an input of a donor-host substrate assembly. A thickness of a carrier layer in the donor-host substrate is polished (e.g., CMP) and/or etched with a wet or dry (e.g., plasma) etch process. Any grind, polish, and/or wet/dry etch process known to be suitable for the composition of the carrier layer may be employed. For example, where the carrier layer is a group IV semiconductor (e.g., silicon) a CMP slurry known to be suitable for thinning the semiconductor may be employed. Likewise, any wet etchant or plasma etch process known to be suitable for thinning the group IV semiconductor may also be employed.

In some embodiments, the above is preceded by cleaving the carrier layer along a fracture plane substantially parallel to the intervening layer. The cleaving or fracture process may be utilized to remove a substantial portion of the carrier layer as a bulk mass, reducing the polish or etch time needed to remove the carrier layer. For example, where a carrier layer is 400-900 µm in thickness, 100-700 µm may be cleaved off by practicing any blanket implant known to promote a wafer-level fracture. In some exemplary embodiments, a light element (e.g., H, He, or Li) is implanted to a uniform target depth within the carrier layer where the fracture plane is desired. Following such a cleaving process, the thickness of the carrier layer remaining in the donor-host substrate assembly may then be polished or etched to complete removal. Alternatively, where the carrier layer is not fractured, the grind, polish and/or etch operation may be employed to remove a greater thickness of the carrier layer.

Next, exposure of an intervening layer is detected. Detection is used to identify a point when the back-side surface of the donor substrate has advanced to nearly the device layer. Any endpoint detection technique known to be suitable for detecting a transition between the materials employed for the carrier layer and the intervening layer may be practiced. In some embodiments, one or more endpoint criteria are based on detecting a change in optical absorbance or emission of the back-side surface of the donor substrate during the polishing or etching performed. In some other embodiments, the endpoint criteria are associated with a change in optical absorbance or emission of byproducts during the polishing or etching of the donor substrate back-side surface. For example, absorbance or emission wavelengths associated with the carrier layer etch byproducts may change as a function of the different compositions of the carrier layer and intervening layer. In other embodiments, the endpoint criteria are associated with a change in mass of species in byproducts of polishing or etching the back-side surface of the donor substrate. For example, the byproducts of processing may be sampled through a quadrupole mass analyzer and a change in the species mass may be correlated to the different compositions of the carrier layer and intervening layer. In another exemplary embodiment, the endpoint criteria is associated with a change in friction between a back-side surface of the donor substrate and a polishing surface in contact with the back-side surface of the donor substrate.

Detection of the intervening layer may be enhanced where the removal process is selective to the carrier layer relative to the intervening layer as non-uniformity in the carrier removal process may be mitigated by an etch rate delta between the carrier layer and intervening layer. Detection may even be skipped if the grind, polish and/or etch operation removes the intervening layer at a rate sufficiently below the rate at which the carrier layer is removed. If an endpoint criteria is not employed, a grind, polish and/or etch operation of a predetermined fixed duration may stop on the intervening layer material if the thickness of the intervening layer is sufficient for the selectivity of the etch. In some examples, the carrier etch rate relative to intervening layer etch rate is 3:1-10:1, or more.

Upon exposing the intervening layer, at least a portion of the intervening layer may be removed. For example, one or more component layers of the intervening layer may be removed. A thickness of the intervening layer may be removed uniformly by a polish, for example. Alternatively, a thickness of the intervening layer may be removed with a masked or blanket etch process. The process may employ the same polish or etch process as that employed to thin the carrier, or may be a distinct process with distinct process parameters. For example, where the intervening layer provides an etch stop for the carrier removal process, the latter operation may employ a different polish or etch process that favors removal of the intervening layer over removal of the device layer. Where less than a few hundred nanometers of intervening layer thickness is to be removed, the removal process may be relatively slow, optimized for across-wafer uniformity, and more precisely controlled than that employed for removal of the carrier layer. A CMP process employed may, for example employ a slurry that offers very high selectively (e.g., 100:1-300:1, or more) between semiconductor (e.g., silicon) and dielectric material (e.g., SiO) surrounding the device layer and embedded within the intervening layer, for example, as electrical isolation between adjacent device regions.

For embodiments where the device layer is revealed through complete removal of the intervening layer, backside processing may commence on an exposed backside of the device layer or specific device regions there in. In some embodiments, the backside device layer processing includes a further polish or wet/dry etch through a thickness of the device layer disposed between the intervening layer and a device region previously fabricated in the device layer, such as a source or drain region.

In some embodiments where the carrier layer, intervening layer, or device layer backside is recessed with a wet and/or plasma etch, such an etch may be a patterned etch or a materially selective etch that imparts significant non-planarity or topography into the device layer back-side surface. As described further below, the patterning may be within a device cell (i.e., "intra-cell patterning) or may be across device cells (i.e., "inter-cell patterning). In some patterned etch embodiments, at least a partial thickness of the intervening layer is employed as a hard mask for back-side device layer patterning. Hence, a masked etch process may preface a correspondingly masked device layer etch.

The above described processing scheme may result in a donor-host substrate assembly that includes IC devices that have a back side of an intervening layer, a back side of the device layer, and/or back side of one or more semiconductor regions within the device layer, and/or front-side metallization revealed. Additional backside processing of any of these revealed regions may then be performed during downstream processing.

It is to be appreciated that the structures resulting from the above exemplary processing schemes may be used in a same or similar form for subsequent processing operations to complete device fabrication, such as PMOS and/or NMOS device fabrication. As an example of a completed device, FIG. 9 illustrate a cross-sectional view of a non-planar integrated circuit structure as taken along a gate line, in accordance with an embodiment of the present disclosure.

Figure 9:
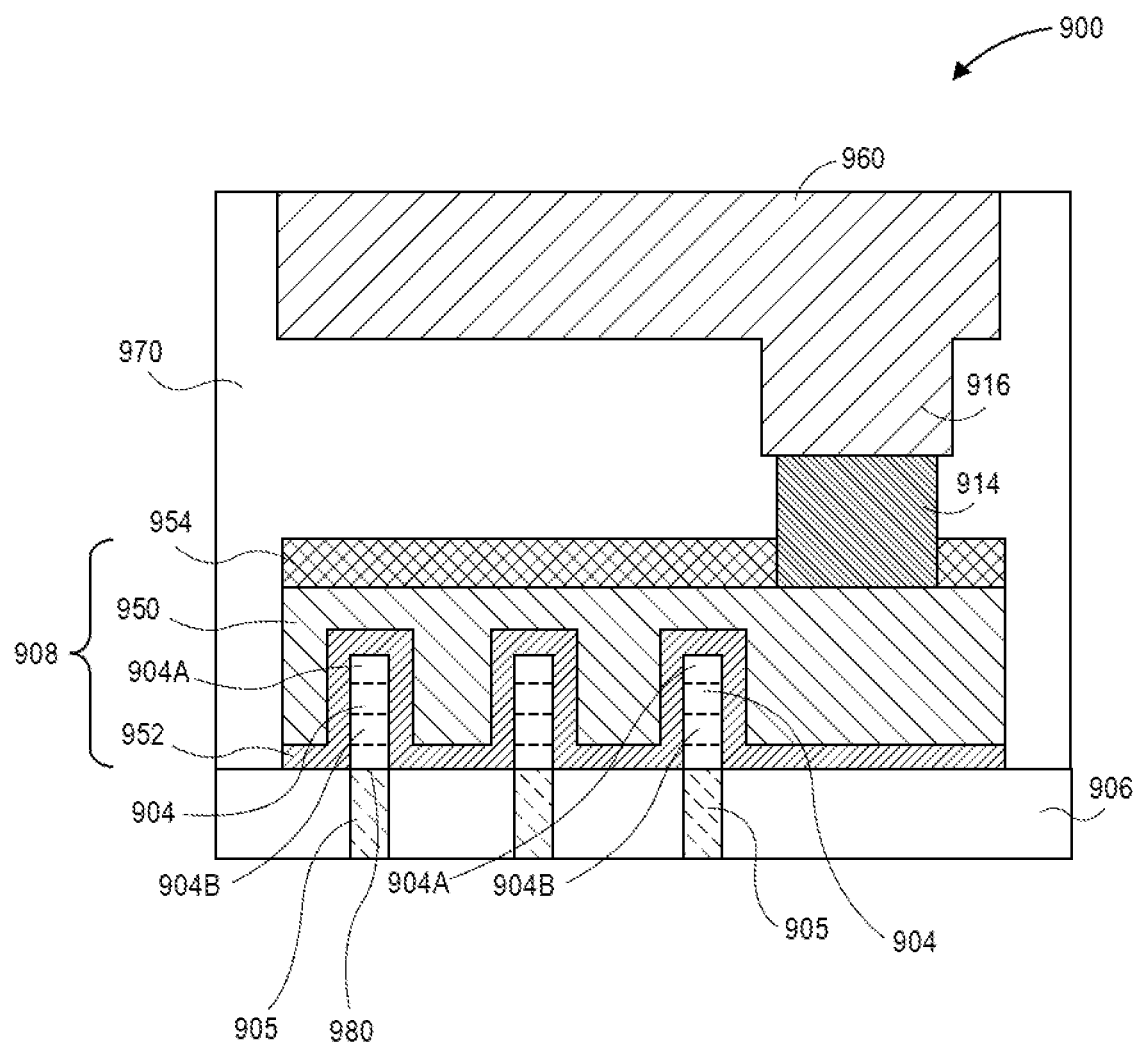
FIG. 9 illustrates a cross-sectional view of a non-planar integrated circuit structure as taken along a gate line, in accordance with an embodiment of the present disclosure.

Referring to FIG. 9, a semiconductor structure or device 900 includes a non-planar active region (e.g., a fin structure including protruding fin portion 904 and sub-fin region 905) within a trench isolation region 906. In an embodiment, instead of a solid fin, the non-planar active region is separated into nanowires (such as nanowires 904A and 904B) above sub-fin region 905, as is represented by the dashed lines. In either case, for ease of description for non-planar integrated circuit structure 900, a non-planar active region 904 is referenced below as a protruding fin portion.

A gate line 908 is disposed over the protruding portions 904 of the non-planar active region (including, if applicable, surrounding nanowires 904A and 904B), as well as over a portion of the trench isolation region 906. As shown, gate line 908 includes a gate electrode 950 and a gate dielectric layer 952. In one embodiment, gate line 908 may also include a dielectric cap layer 954. A gate contact 914, and overlying gate contact via 916 are also seen from this perspective, along with an overlying metal interconnect 960, all of which are disposed in inter-layer dielectric stacks or layers 970. Also seen from the perspective of FIG. 9, the gate contact 914 is, in one embodiment, disposed over trench isolation region 906, but not over the non-planar active regions.

In an embodiment, the semiconductor structure or device 900 is a non-planar device such as, but not limited to, a fin-FET device, a tri-gate device, a nano-ribbon device, or a nano-wire device. In such an embodiment, a corresponding semiconducting channel region is composed of or is formed in a three-dimensional body. In one such embodiment, the gate electrode stacks of gate lines 908 surround at least a top surface and a pair of sidewalls of the three-dimensional body.

As is also depicted in FIG. 9, in an embodiment, an interface 980 exists between a protruding fin portion 904 and sub-fin region 905. The interface 980 can be a transition region between a doped sub-fin region 905 and a lightly or undoped upper fin portion 904. In one such embodiment, each fin is approximately 10 nanometers wide or less, and sub-fin dopants are supplied from an adjacent solid state doping layer at the sub-fin location. In a particular such embodiment, each fin is less than 10 nanometers wide.

Although not depicted in FIG. 9, it is to be appreciated that source or drain regions of or adjacent to the protruding fin portions 904 are on either side of the gate line 908, i.e., into and out of the page. In one embodiment, the source or drain regions are doped portions of original material of the protruding fin portions 904. In another embodiment, the material of the protruding fin portions 904 is removed and replaced with another semiconductor material, e.g., by epitaxial deposition to form discrete epitaxial nubs or non-discrete epitaxial structures. In either embodiment, the source or drain regions may extend below the height of dielectric layer of trench isolation region 906, i.e., into the sub-fin region 905. In accordance with an embodiment of the present disclosure, the more heavily doped sub-fin regions, i.e., the doped portions of the fins below interface 980, inhibits source to drain leakage through this portion of the bulk semiconductor fins. In an embodiment, the source and drain structures are N-type epitaxial source and drain structures, both including phosphorous dopant impurity atoms. In accordance with one or more embodiments of the present disclosure, the source and drain regions have associated asymmetric source and drain contact structures, as described above in association with FIG. 8J.

With reference again to FIG. 9, in an embodiment, fins 904/905 (and, possibly nanowires 904A and 904B) are composed of a crystalline silicon, silicon/germanium or germanium layer doped with a charge carrier, such as but not limited to phosphorus, arsenic, boron or a combination thereof. In one embodiment, the concentration of silicon atoms is greater than 97%. In another embodiment, fins 904/905 are composed of a group III-V material, such as, but not limited to, gallium nitride, gallium phosphide, gallium arsenide, indium phosphide, indium antimonide, indium gallium arsenide, aluminum gallium arsenide, indium gallium phosphide, or a combination thereof. Trench isolation region 906 may be composed of a dielectric material such as, but not limited to, silicon dioxide, silicon oxy-nitride, silicon nitride, or carbon-doped silicon nitride.

Gate line 908 may be composed of a gate electrode stack which includes a gate dielectric layer 952 and a gate electrode layer 950. In an embodiment, the gate electrode of the gate electrode stack is composed of a metal gate and the gate dielectric layer is composed of a high-K material. For example, in one embodiment, the gate dielectric layer is composed of a material such as, but not limited to, hafnium oxide, hafnium oxy-nitride, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate, or a combination thereof. Furthermore, a portion of gate dielectric layer may include a layer of native oxide formed from the top few layers of the substrate fin 904. In an embodiment, the gate dielectric layer is composed of a top high-k portion and a lower portion composed of an oxide of a semiconductor material. In one embodiment, the gate dielectric layer is composed of a top portion of hafnium oxide and a bottom portion of silicon dioxide or silicon oxy-nitride. In some implementations, a portion of the gate dielectric is a "U"-shaped structure that includes a bottom portion substantially parallel to the surface of the substrate and two sidewall portions that are substantially perpendicular to the top surface of the substrate.

In one embodiment, the gate electrode layer includes an N-type workfunction metal. In some implementations, the gate electrode layer may consist of a stack of two or more metal layers, where one or more metal layers are workfunction metal layers and at least one metal layer is a conductive fill layer. In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, the gate electrode layer 950 is an N-type gate stack including a compressively stressing gate electrode.

An N-type metal layer may enable the formation of an NMOS gate electrode with a workfunction that is between about 3.9 eV and about 4.2 eV. In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

Spacers associated with the gate electrode stacks may be composed of a material suitable to ultimately electrically isolate, or contribute to the isolation of, a permanent gate structure from adjacent conductive contacts, such as self-aligned contacts. For example, in one embodiment, the spacers are composed of a dielectric material such as, but not limited to, silicon dioxide, silicon oxy-nitride, silicon nitride, or carbon-doped silicon nitride.

Gate contact 914 and overlying gate contact via 916 may be composed of a conductive material. In an embodiment, one or more of the contacts or vias are composed of a metal species. The metal species may be a pure metal, such as tungsten, nickel, or cobalt, or may be an alloy such as a metal-metal alloy or a metal-semiconductor alloy (e.g., such as a silicide material).

In an embodiment (although not shown), a contact pattern which is essentially perfectly aligned to an existing gate pattern 908 is formed while eliminating the use of a lithographic step with exceedingly tight registration budget. In an embodiment, the contact pattern is a vertically asymmetric contact pattern, such as described in association with FIG. 8J. In other embodiments, all contacts are front side connected and are not asymmetric. In one such embodiment, the self-aligned approach enables the use of intrinsically highly selective wet etching (e.g., versus conventionally implemented dry or plasma etching) to generate contact openings. In an embodiment, a contact pattern is formed by utilizing an existing gate pattern in combination with a contact plug lithography operation. In one such embodiment, the approach enables elimination of the need for an otherwise critical lithography operation to generate a contact pattern, as used in conventional approaches. In an embodiment, a trench contact grid is not separately patterned, but is rather formed between poly (gate) lines. For example, in one such embodiment, a trench contact grid is formed subsequent to gate grating patterning but prior to gate grating cuts.

In an embodiment, providing structure 900 involves fabrication of the gate stack structure 908 by a replacement gate process. In such a scheme, dummy gate material such as polysilicon or silicon nitride pillar material, may be removed and replaced with permanent gate electrode material. In one such embodiment, a permanent gate dielectric layer is also formed in this process, as opposed to being carried through from earlier processing. In an embodiment, dummy gates are removed by a dry etch or wet etch process. In one embodiment, dummy gates are composed of polycrystalline silicon or amorphous silicon and are removed with a dry etch process including use of $SF_6$. In another embodiment, dummy gates are composed of polycrystalline silicon or amorphous silicon and are removed with a wet etch process including use of aqueous $NH_4OH$ or tetramethylammonium hydroxide. In one embodiment, dummy gates are composed of silicon nitride and are removed with a wet etch including aqueous phosphoric acid.

Referring again to FIG. 9, the arrangement of semiconductor structure or device 900 places the gate contact over isolation regions. Such an arrangement may be viewed as inefficient use of layout space. In another embodiment, however, a semiconductor device has contact structures that contact portions of a gate electrode formed over an active region, e.g., over a fin 905, and in a same layer as a trench contact via.

It is to be appreciated that not all aspects of the processes described above need be practiced to fall within the spirit and scope of embodiments of the present disclosure. For example, in one embodiment, dummy gates need not ever be formed prior to fabricating gate contacts over active portions of the gate stacks. The gate stacks described above may actually be permanent gate stacks as initially formed. Also, the processes described herein may be used to fabricate one or a plurality of semiconductor devices. The semiconductor devices may be transistors or like devices. For example, in an embodiment, the semiconductor devices are a metal-oxide semiconductor (MOS) transistors for logic or memory, or are bipolar transistors. Also, in an embodiment, the semiconductor devices have a three-dimensional architecture, such as a tri-gate device, an independently accessed double gate device, or a FIN-FET. One or more embodiments may be particularly useful for fabricating semiconductor devices at a sub-10 nanometer (10 nm) technology node.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide ($SiO_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, metal lines or interconnect line material (and via material) is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers (e.g., layers including one or more of Ta, TaN, Ti or TiN), stacks of different metals or alloys, etc. Thus, the interconnect lines may be a single material layer, or may be formed from several layers, including conductive liner layers and fill layers. Any suitable deposition process, such as electroplating, chemical vapor deposition or physical vapor deposition, may be used to form interconnect lines. In an embodiment, the interconnect lines are composed of a conductive material such as, but not limited to, Cu, Al, Ti, Zr, Hf, V, Ru, Co, Ni, Pd, Pt, W, Ag, Au or alloys thereof. The interconnect lines are also sometimes referred to in the art as traces, wires, lines, metal, or simply interconnect.

In an embodiment, as is also used throughout the present description, hardmask materials, capping layers, or plugs are composed of dielectric materials different from the interlayer dielectric material. In one embodiment, different hardmask, capping or plug materials may be used in different regions so as to provide different growth or etch selectivity to each other and to the underlying dielectric and metal layers. In some embodiments, a hardmask layer, capping or plug layer includes a layer of a nitride of silicon (e.g., silicon nitride) or a layer of an oxide of silicon, or both, or a combination thereof. Other suitable materials may include carbon-based materials. Other hardmask, capping or plug layers known in the arts may be used depending upon the particular implementation. The hardmask, capping or plug layers maybe formed by CVD, PVD, or by other deposition methods.

In an embodiment, as is also used throughout the present description, lithographic operations are performed using 193 nm immersion litho (i193), EUV and/or EBDW lithography, or the like. A positive tone or a negative tone resist may be used. In one embodiment, a lithographic mask is a trilayer mask composed of a topographic masking portion, an anti-reflective coating (ARC) layer, and a photoresist layer. In a particular such embodiment, the topographic masking portion is a carbon hardmask (CHM) layer and the anti-reflective coating layer is a silicon ARC layer.

In another aspect, one or more embodiments are directed to neighboring semiconductor structures or devices separated by self-aligned gate endcap (SAGE) structures. Particular embodiments may be directed to integration of multiple width (multi-Wsi) nanowires and nanoribbons in a SAGE architecture and separated by a SAGE wall. In an embodiment, nanowires/nanoribbons are integrated with multiple Wsi in a SAGE architecture portion of a front end process flow. Such a process flow may involve integration of nanowires and nanoribbons of different Wsi to provide robust functionality of next generation transistors with low power and high performance. Associated epitaxial source or drain regions may be embedded (e.g., portions of nanowires removed and then source or drain (S/D) growth is performed) or formed by vertical merging (e.g., epitaxial regions are formed around existing wires), as described in greater detail below in association with FIGS. 13A-13E.

To provide further context, advantages of a self-aligned gate endcap (SAGE) architecture may include the enabling of higher layout density and, in particular, scaling of diffusion to diffusion spacing. To provide illustrative comparison, FIG. 10 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Figure 10:
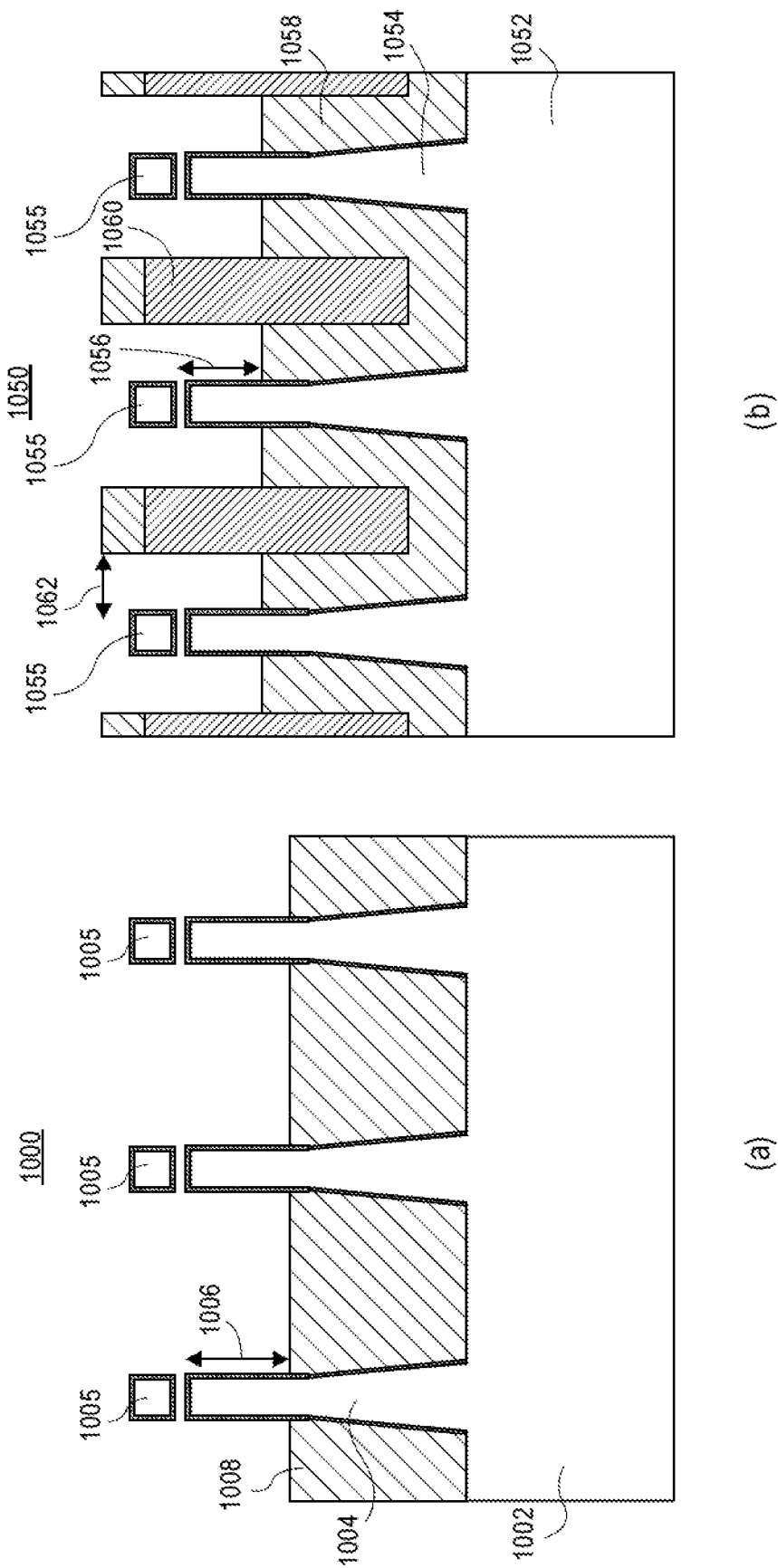
FIG. 10 illustrates cross-sectional views taken through nanowires and fins for a non-endcap architecture (left-hand side (a)) versus a self-aligned gate endcap (SAGE) architecture (right-hand side (b)), in accordance with an embodiment of the present disclosure.

Referring to the left-hand side (a) of FIG. 10, an integrated circuit structure 1000 includes a substrate 1002 having fins 1004 protruding therefrom by an amount 1006 above an isolation structure 1008 laterally surrounding lower portions of the fins 1004. Corresponding nanowires 1005 are over the fins 1004. A gate structure may be formed over the integrated circuit structure 1000 to fabricate a device. However, breaks in such a gate structure may be accommodated for by increasing the spacing between fin 1004/nanowire 1005 pairs.

By contrast, referring to the right-hand side (b) of FIG. 10, an integrated circuit structure 1050 includes a substrate 1052 having fins 1054 protruding therefrom by an amount 1056 above an isolation structure 1058 laterally surrounding lower portions of the fins 1004. Corresponding nanowires 1005 are over the fins 1004. Isolating SAGE walls 1060 (which may include a hardmask thereon, as depicted) are included within the isolation structure 1052 and between adjacent fin 1054/nanowire 1055 pairs. The distance between an isolating SAGE wall 1060 and a nearest fin 1054/nanowire 1055 pair defines the gate endcap spacing 1062. A gate structure may be formed over the integrated circuit structure 1000, between insolating SAGE walls to fabricate a device. Breaks in such a gate structure are imposed by the isolating SAGE walls. Since the isolating SAGE walls 1060 are self-aligned, restrictions from conventional approaches can be minimized to enable more aggressive diffusion to diffusion spacing. Furthermore, since gate structures include breaks at all locations, individual gate structure portions may be layer connected by local interconnects formed over the isolating SAGE walls 1060. In an embodiment, as depicted, the SAGE walls 1060 each include a lower dielectric portion and a dielectric cap on the lower dielectric portion.

In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, an associated gate stack is an N-type gate stack including a compressively stressing gate electrode. In one embodiment, associated epitaxial source or drain structures are N-type epitaxial source or drain structures, both including phosphorous dopant impurity atoms.

A self-aligned gate endcap (SAGE) processing scheme involves the formation of gate/trench contact endcaps self-aligned to fins without requiring an extra length to account for mask mis-registration. Thus, embodiments may be implemented to enable shrinking of transistor layout area. Embodiments described herein may involve the fabrication of gate endcap isolation structures, which may also be referred to as gate walls, isolation gate walls or self-aligned gate endcap (SAGE) walls.

Figure 11:
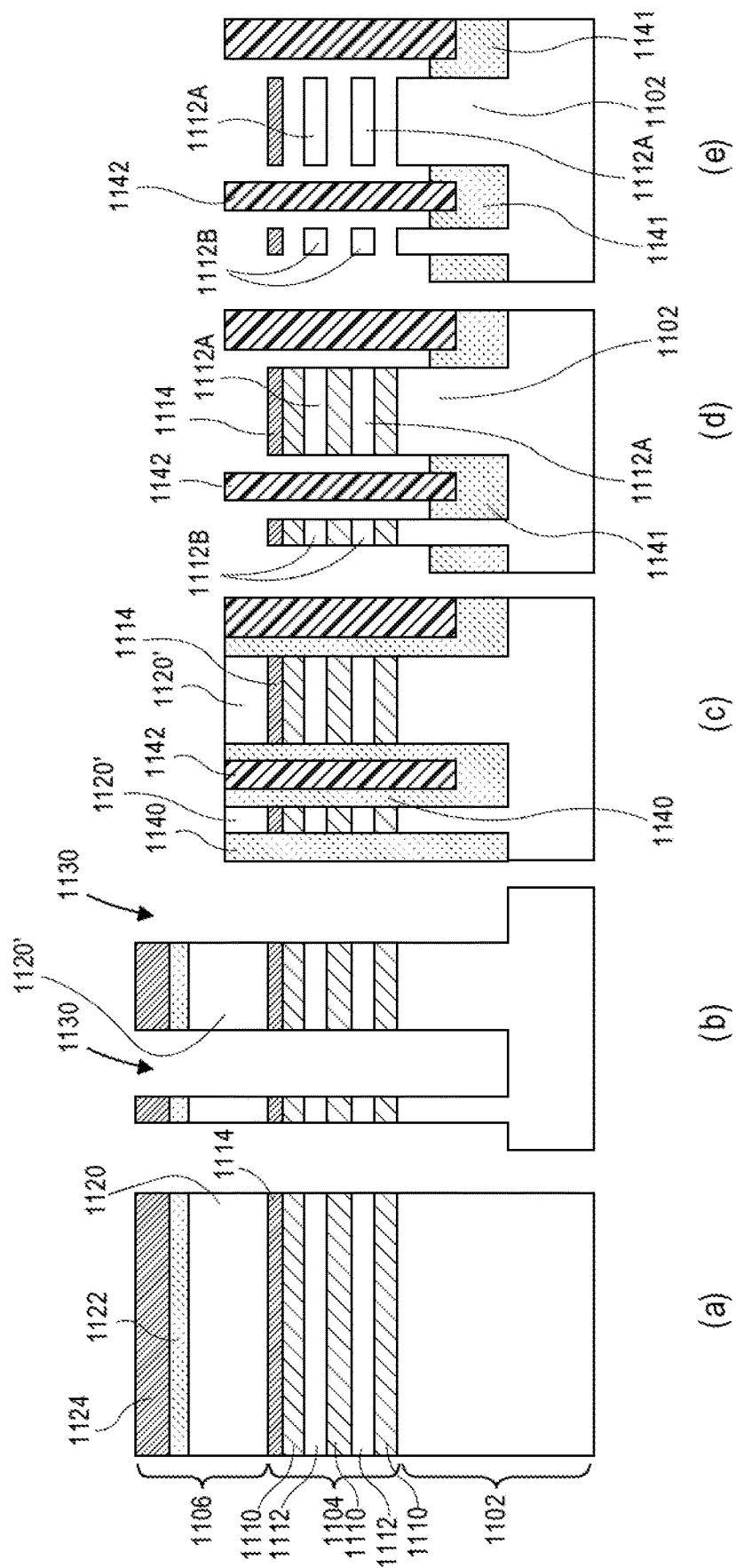
FIG. 11 illustrates cross-sectional views representing various operations in a method of fabricating a self-aligned gate endcap (SAGE) structure with gate-all-around devices, in accordance with an embodiment of the present disclosure.

In an exemplary processing scheme for structures having SAGE walls separating neighboring devices, FIG. 11 illustrate cross-sectional views representing various operations in a method of fabricating a self-aligned gate endcap (SAGE) structure with gate-all-around devices, in accordance with an embodiment of the present disclosure.

Referring to part (a) of FIG. 11, a starting structure includes a nanowire patterning stack 1104 above a substrate 1102. A lithographic patterning stack 1106 is formed above the nanowire patterning stack 1104. The nanowire patterning stack 1104 includes alternating silicon germanium layers 1110 and silicon layers 1112. A protective mask 1114 is between the nanowire patterning stack 1104 and the lithographic patterning stack 1106. In one embodiment, the lithographic patterning stack 1106 is trilayer mask composed of a topographic masking portion 1120, an anti-reflective coating (ARC) layer 1122, and a photoresist layer 1124. In a particular such embodiment, the topographic masking portion 1120 is a carbon hardmask (CHM) layer and the anti-reflective coating layer 1122 is a silicon ARC layer.

Referring to part (b) of FIG. 11, the stack of part (a) is lithographically patterned and then etched to provide an etched structure including a patterned substrate 1102 and trenches 1130.

Referring to part (c) of FIG. 11, the structure of part (b) has an isolation layer 1140 and a SAGE material 1142 formed in trenches 1130. The structure is then planarized to leave patterned topographic masking layer 1120' as an exposed upper layer.

Referring to part (d) of FIG. 11, the isolation layer 1140 is recessed below an upper surface of the patterned substrate 1102, e.g., to define a protruding fin portion and to provide a trench isolation structure 1141 beneath SAGE walls 1142.

Referring to part (e) of FIG. 11, the silicon germanium layers 1110 are removed at least in the channel region to release silicon nanowires 1112A and 1112B. Subsequent to the formation of the structure of part (e) of FIG. 11, a gate stacks may be formed around nanowires 1112B or 1112A, over protruding fins of substrate 1102, and between SAGE walls 1142. In one embodiment, prior to formation of the gate stacks, the remaining portion of protective mask 1114 is removed. In another embodiment, the remaining portion of protective mask 1114 is retained as an insulating fin hat as an artifact of the processing scheme.

Referring again to part (e) of FIG. 11, it is to be appreciated that a channel view is depicted, with source or drain regions being locating into and out of the page. In an embodiment, the channel region including nanowires 1112B has a width less than the channel region including nanowires 1112A. Thus, in an embodiment, an integrated circuit structure includes multiple width (multi-Wsi) nanowires. Although structures of 1112B and 1112A may be differentiated as nanowires and nanoribbons, respectively, both such structures are typically referred to herein as nanowires. It is also to be appreciated that reference to or depiction of a fin/nanowire pair throughout may refer to a structure including a fin and one or more overlying nanowires (e.g., two overlying nanowires are shown in FIG. 11).

In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, an associated gate stack is an N-type gate stack. In one embodiment, associated epitaxial source or drain structures are N-type epitaxial source or drain structures, both including phosphorous dopant impurity atoms.

To highlight an exemplary integrated circuit structure having three vertically arranged nanowires, FIG. 12A illustrates a three-dimensional cross-sectional view of a nanowire-based integrated circuit structure, in accordance with an embodiment of the present disclosure. FIG. 12B illustrates a cross-sectional source or drain view of the nanowire-based integrated circuit structure of FIG. 12A, as taken along the a-a' axis. FIG. 12C illustrates a cross-sectional channel view of the nanowire-based integrated circuit structure of FIG. 12A, as taken along the b-b' axis.

Referring to FIG. 12A, an integrated circuit structure 1200 includes one or more vertically stacked nanowires (1204 set) above a substrate 1202. An optional fin between the bottommost nanowire and the substrate 1202 is not depicted for the sake of emphasizing the nanowire portion for illustrative purposes. Embodiments herein are targeted at both single wire devices and multiple wire devices. As an example, a three nanowire-based devices having nanowires 1204A, 1204B and 1204C is shown for illustrative purposes. For convenience of description, nanowire 1204A is used as an example where description is focused on one of the nanowires. It is to be appreciated that where attributes of one nanowire are described, embodiments based on a plurality of nanowires may have the same or essentially the same attributes for each of the nanowires.

Each of the nanowires 1204 includes a channel region 1206 in the nanowire. The channel region 1206 has a length (L). Referring to FIG. 12C, the channel region also has a perimeter (Pc) orthogonal to the length (L). Referring to both FIGS. 12A and 12C, a gate electrode stack 1208 surrounds the entire perimeter (Pc) of each of the channel regions 1206. The gate electrode stack 1208 includes a gate electrode along with a gate dielectric layer between the channel region 1206 and the gate electrode (not shown). In an embodiment, the channel region is discrete in that it is completely surrounded by the gate electrode stack 1208 without any intervening material such as underlying substrate material or overlying channel fabrication materials. Accordingly, in embodiments having a plurality of nanowires 1204, the channel regions 1206 of the nanowires are also discrete relative to one another.

Referring to both FIGS. 12A and 12B, integrated circuit structure 1200 includes a pair of non-discrete source or drain regions 1210/1212. The pair of non-discrete source or drain regions 1210/1212 is on either side of the channel regions 1206 of the plurality of vertically stacked nanowires 1204. Furthermore, the pair of non-discrete source or drain regions 1210/1212 is adjoining for the channel regions 1206 of the plurality of vertically stacked nanowires 1204. In one such embodiment, not depicted, the pair of non-discrete source or drain regions 1210/1212 is directly vertically adjoining for the channel regions 1206 in that epitaxial growth is on and between nanowire portions extending beyond the channel regions 1206, where nanowire ends are shown within the source or drain structures. In another embodiment, as depicted in FIG. 12A, the pair of non-discrete source or drain regions 1210/1212 is indirectly vertically adjoining for the channel regions 1206 in that they are formed at the ends of the nanowires and not between the nanowires.

In an embodiment, as depicted, the source or drain regions 1210/1212 are non-discrete in that there are not individual and discrete source or drain regions for each channel region 1206 of a nanowire 1204. Accordingly, in embodiments having a plurality of nanowires 1204, the source or drain regions 1210/1212 of the nanowires are global or unified source or drain regions as opposed to discrete for each nanowire. In one embodiment, from a cross-sectional perspective orthogonal to the length of the discrete channel regions 1206, each of the pair of non-discrete source or drain regions 1210/1212 is approximately rectangular in shape with a bottom tapered portion and a top vertex portion, as depicted in FIG. 12B. In other embodiments, however, the source or drain regions 1210/1212 of the nanowires are relatively larger yet discrete non-vertically merged epitaxial structures such as nubs described in association with FIGS. 8F-8J.

In accordance with an embodiment of the present disclosure, and as depicted in FIGS. 12A and 12B, integrated circuit structure 1200 further includes a pair of contacts 1214, each contact 1214 on one of the pair of non-discrete source or drain regions 1210/1212. In one such embodiment, in a vertical sense, each contact 1214 completely surrounds the respective non-discrete source or drain region 1210/1212. In another aspect, the entire perimeter of the non-discrete source or drain regions 1210/1212 may not be accessible for contact with contacts 1214, and the contact 1214 thus only partially surrounds the non-discrete source or drain regions 1210/1212, as depicted in FIG. 12B. In a contrasting embodiment, not depicted, the entire perimeter of the non-discrete source or drain regions 1210/1212, as taken along the a-a' axis, is surrounded by the contacts 1214. In accordance with an embodiment of the present disclosure, although not depicted, the pair of contacts 1214 is an asymmetric pair of contacts, as described in association with FIG. 8J.

Referring to FIGS. 12B and 12C, the non-discrete source or drain regions 1210/1212 are global in the sense that a single unified feature is used as a source or drain region for a plurality (in this case, 3) of nanowires 1204 and, more particularly, for more than one discrete channel region 1206. In an embodiment, the pair of non-discrete source or drain regions 1210/1212 is composed of a semiconductor material different than the semiconductor material of the discrete channel regions 1206, e.g., the pair of non-discrete source or drain regions 1210/1212 is composed of a silicon germanium while the discrete channel regions 1206 are composed of silicon. In another embodiment, the pair of non-discrete source or drain regions 1210/1212 is composed of a semiconductor material the same or essentially the same as the semiconductor material of the discrete channel regions 1206, e.g., both the pair of non-discrete source or drain regions 1210/1212 and the discrete channel regions 1206 are composed of silicon.

Referring again to FIG. 12A, in an embodiment, integrated circuit structure 1200 further includes a pair of spacers 1216. As is depicted, outer portions of the pair of spacers 1216 may overlap portions of the non-discrete source or drain regions 1210/1212, providing for "embedded" portions of the non-discrete source or drain regions 1210/1212 beneath the pair of spacers 1216. As is also depicted, the embedded portions of the non-discrete source or drain regions 1210/1212 may not extend beneath the entirety of the pair of spacers 1216.

In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, the gate stack 1208 is an N-type gate stack including a compressively stressing gate electrode. In one embodiment, the first epitaxial source or drain structure 1210 and the second epitaxial source or drain structure 1212 are a first N-type epitaxial source or drain structure and a second N-type epitaxial source or drain structure, respectively, both including phosphorous dopant impurity atoms.

Substrate 1202 may be composed of a material suitable for integrated circuit structure fabrication. In one embodiment, substrate 1202 includes a lower bulk substrate composed of a single crystal of a material which may include, but is not limited to, silicon, germanium, silicon-germanium or a III-V compound semiconductor material. An upper insulator layer composed of a material which may include, but is not limited to, silicon dioxide, silicon nitride or silicon oxy-nitride is on the lower bulk substrate. Thus, the structure 1200 may be fabricated from a starting semiconductor-on-insulator substrate. Alternatively, the structure 1200 is formed directly from a bulk substrate and local oxidation is used to form electrically insulative portions in place of the above described upper insulator layer. In another alternative embodiment, the structure 1200 is formed directly from a bulk substrate and doping is used to form electrically isolated active regions, such as nanowires, thereon. In one such embodiment, the first nanowire (i.e., proximate the substrate) is in the form of an omega-FET type structure.

In an embodiment, the nanowires 1204 may be sized as wires or ribbons, as described below, and may have squared-off or rounder corners. In an embodiment, the nanowires 1204 are composed of a material such as, but not limited to, silicon, germanium, or a combination thereof. In one such embodiment, the nanowires are single-crystalline. For example, for a silicon nanowire 1204, a single-crystalline nanowire may be based from a (100) global orientation, e.g., with a <100> plane in the z-direction. As described below, other orientations may also be considered. In an embodiment, the dimensions of the nanowires 1204, from a cross-sectional perspective, are on the nano-scale. For example, in a specific embodiment, the smallest dimension of the nanowires 1204 is less than approximately 20 nanometers. In an embodiment, the nanowires 1204 are composed of a strained material, particularly in the channel regions 1206.

Referring to FIGS. 12C, in an embodiment, each of the channel regions 1206 has a width (Wc) and a height (Hc), the width (Wc) approximately the same as the height (Hc). That is, in both cases, the channel regions 1206 are square-like or, if corner-rounded, circle-like in cross-section profile. In another aspect, the width and height of the channel region need not be the same, such as the case for nanoribbbons as described throughout.

In another aspect, methods of fabricating a nanowire portion of a fin/nanowire integrated circuit structure are provided. For example, FIGS. 13A-13E illustrate three-dimensional cross-sectional views representing various operations in a method of fabricating a nanowire portion of a fin/nanowire structure, in accordance with an embodiment of the present disclosure.

Figure 13A:
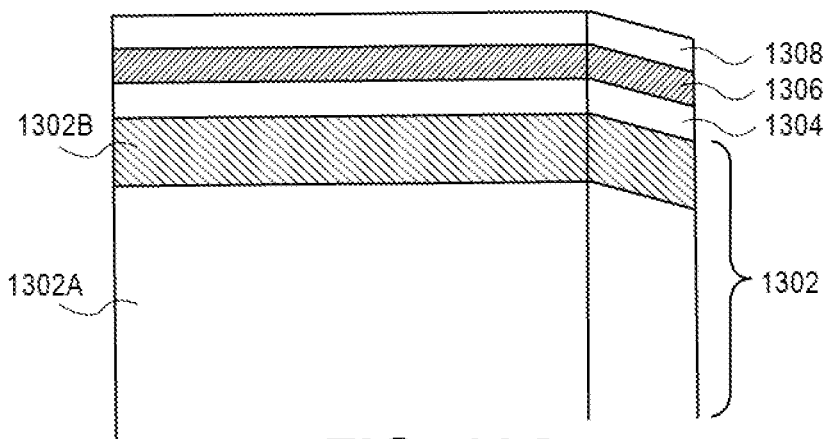
FIGS. 13A-13E illustrate three-dimensional cross-sectional views representing various operations in a method of fabricating a nanowire portion of a fin/nanowire structure, in accordance with an embodiment of the present disclosure.

A method of fabricating a nanowire integrated circuit structure may include forming a nanowire above a substrate. In a specific example showing the formation of two silicon nanowires, FIG. 13A illustrates a substrate 1302 (e.g., composed of a bulk substrate silicon substrate 1302A with an insulating silicon dioxide layer 1302B there on) having a silicon layer 1304/silicon germanium layer 1306/silicon layer 1308 stack thereon. It is to be understood that, in another embodiment, a silicon germanium layer/silicon layer/silicon germanium layer stack may be used to ultimately form two silicon germanium nanowires.

Figure 13B:
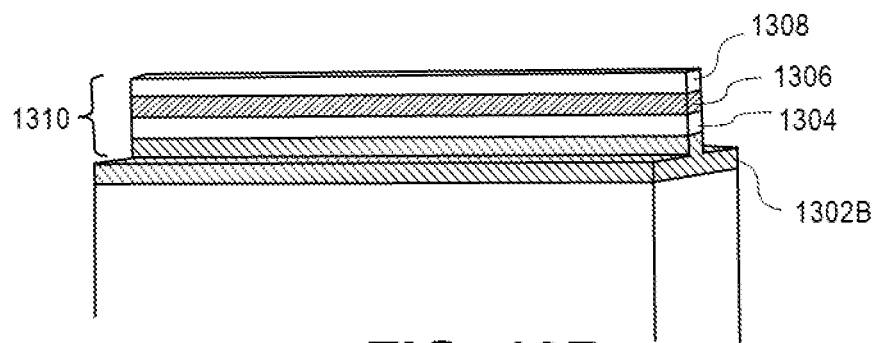

Referring to FIG. 13B, a portion of the silicon layer 1304/silicon germanium layer 1306/silicon layer 1308 stack as well as a top portion of the silicon dioxide layer 1302B is patterned into a fin-type structure 1310, e.g., with a mask and plasma etch process. It is to be appreciated that, for illustrative purposes, the etch for FIG. 13B is shown as forming two silicon nanowire precursor portions. Although the etch is shown for ease of illustration as ending within a bottom isolation layer, more complex stacks are contemplated within the context of embodiments of the present disclosure. For example, the process may be applied to a nanowire/fin stack as described in association with FIG. 11.

Figure 13C:
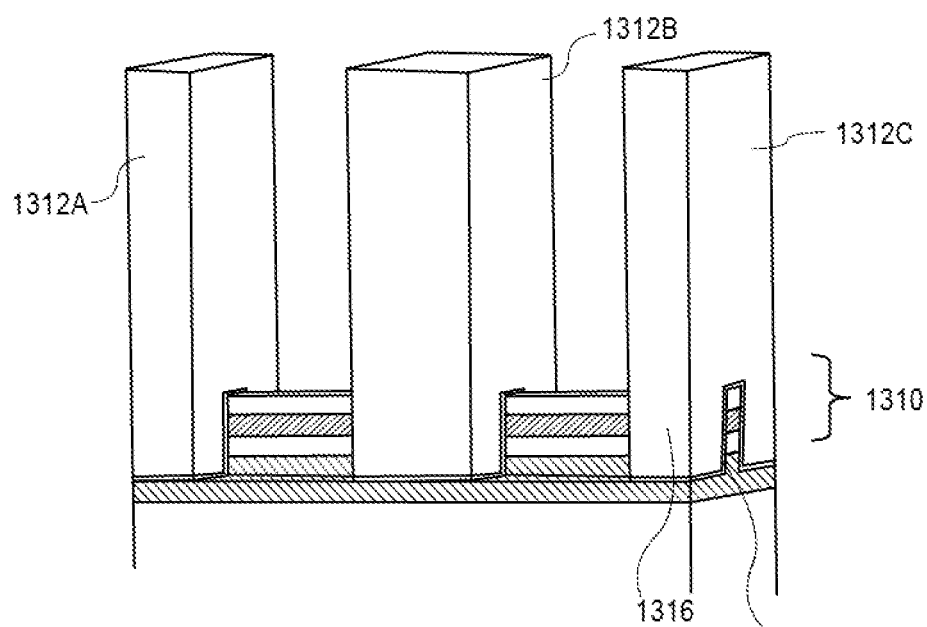

The method may also include forming a channel region in the nanowire, the channel region having a length and a perimeter orthogonal to the length. In a specific example showing the formation of three gate structures over the two silicon nanowires, FIG. 13C illustrates the fin-type structure 1310 with three sacrificial gates 1312A, 1312B, and 1312C thereon. In one such embodiment, the three sacrificial gates 1312A, 1312B, and 1312C are composed of a sacrificial gate oxide layer 1314 and a sacrificial polysilicon gate layer 1316 which are blanket deposited and patterned with a plasma etch process.

Figure 13D:
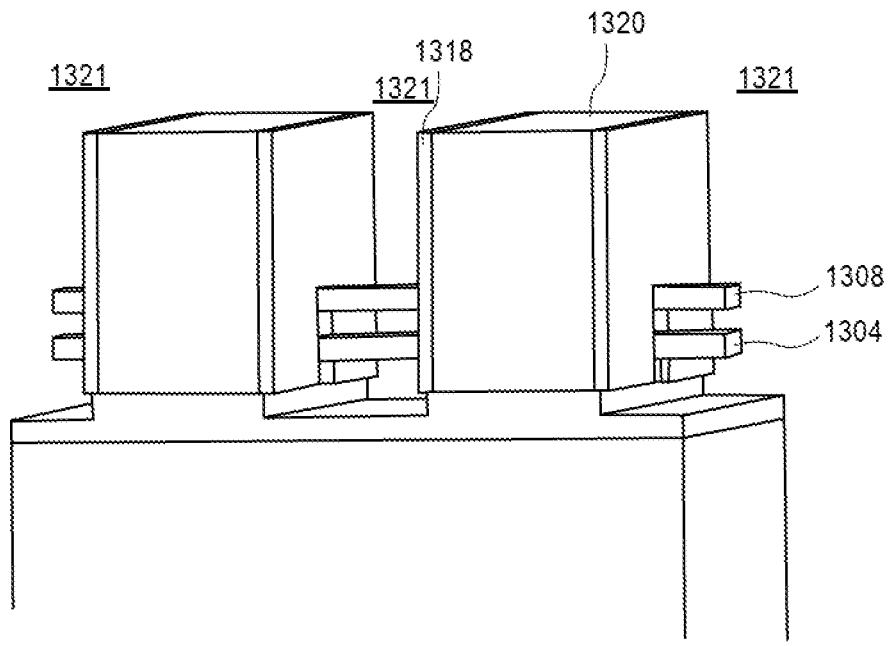

Following patterning to form the three sacrificial gates 1312A, 1312B, and 1312C, spacers may be formed on the sidewalls of the three sacrificial gates 1312A, 1312B, and 1312C, doping may be performed (e.g., tip and/or source and drain type doping), and an interlayer dielectric layer may be formed to cover the three sacrificial gates 1312A, 1312B, and 1312C. The interlayer dielectric layer may be polished to expose the three sacrificial gates 1312A, 1312B, and 1312C for a replacement gate, or gate-last, process. Referring to FIG. 13D, the three sacrificial gates 1312A, 1312B, and 1312C have been removed, leaving spacers 1318 and a portion of the interlayer dielectric layer 1320 remaining.

Additionally, referring again to FIG. 13D the portions of the silicon germanium layer 1306 and the portion of the insulating silicon dioxide layer 1302B of the fin structure 1310 are removed in the regions originally covered by the three sacrificial gates 1312A, 1312B, and 1312C. Discrete portions of the silicon layers 1304 and 1308 thus remain, as depicted in FIG. 13D.

The discrete portions of the silicon layers 1304 and 1308 shown in FIG. 13D will, in one embodiment, ultimately become channel regions in a nanowire-based device. Thus, at the process stage depicted in FIG. 13D, channel engineering or tuning may be performed. For example, in one embodiment, the discrete portions of the silicon layers 1304 and 1308 shown in FIG. 13D are thinned using oxidation and etch processes. Such an etch process may be performed at the same time the wires are separated by etching the silicon germanium layer 1306. Accordingly, the initial wires formed from silicon layers 1304 and 1308 begin thicker and are thinned to a size suitable for a channel region in a nanowire device, independent from the sizing of the source and drain regions of the device. Thus, in an embodiment, forming the channel region includes removing a portion of the nanowire, and the resulting perimeters of the source and drain regions (described below) are greater than the perimeter of the resulting channel region.

Figure 13E:
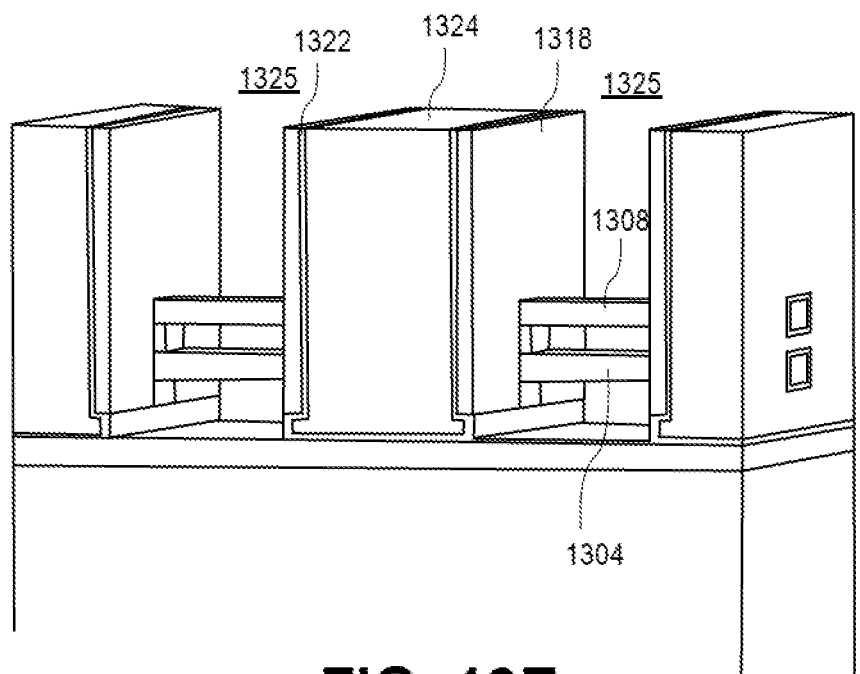

The method may also include forming a gate electrode stack surrounding the entire perimeter of the channel region. In the specific example showing the formation of three gate structures over the two silicon nanowires, FIG. 13E illustrates the structure following deposition of a gate dielectric layer 1322 (such as a high-k gate dielectric layer) and a gate electrode layer 1324 (such as a metal gate electrode layer), and subsequent polishing, in between the spacers 1318. That is, gate structures are formed in the trenches 1321 of FIG. 13D. Additionally, FIG. 13E depicts the result of the subsequent removal of the interlayer dielectric layer 1320 after formation of the permanent gate stack. The portions of the silicon germanium layer 1306 and the portion of the insulating silicon dioxide layer 1302B of the fin structure 1310 are also removed in the regions originally covered by the portion of the interlayer dielectric layer 1320 depicted in FIG. 13D. Discrete portions of the silicon layers 1304 and 1308 thus remain, as depicted in FIG. 13E.

In accordance with an embodiment of the present disclosure, a compressive metal gate material and (110) wafer orientation are used in combination to impart tensile channel stress along a <110> transport direction and tensile vertical stress along a <110> direction to enhance nanowire performance. In one embodiment, the permanent gate electrode 1324 is an N-type gate stack including a compressively stressing gate electrode.

The method may also include forming a pair of source and drain regions in the nanowire, on either side of the channel region, each of the source and drain regions having a perimeter orthogonal to the length of the channel region. Specifically, the discrete portions of the silicon layers 1304 and 1308 shown in FIG. 13E will, in one embodiment, ultimately become at least a portion of the source and drain regions in a nanowire-based device. In one such embodiment, epitaxial source or drain structures are formed by merging epitaxial material around existing nanowires 1304 and 1308. In another embodiment, epitaxial source or drain structures are embedded, e.g., portions of nanowires 1304 and 1308 are removed and then source or drain (S/D) growth is performed. In the latter case, in accordance with an embodiment of the present disclosure, such epitaxial source or drain structures may be non-discrete, as exemplified in association with FIGS. 12A and 12B, or may be discrete, as exemplified in association with FIG. 8J. In either case, in one embodiment, source or drain structures are N-type epitaxial source or drain structures, both including phosphorous dopant impurity atoms.

The method may subsequently include forming a pair of contacts, a first of the pair of contacts completely or nearly completely surrounding the perimeter of the source region, and a second of the pair of contacts completely or nearly completely surrounding the perimeter of the drain region. In an embodiment, the pair of contacts is an asymmetric pair of source and drain contact structures, such as described in association with FIG. 8J. In other embodiments, the pair of contacts is a symmetric pair of source and drain contact structures. Specifically, contacts are formed in the trenches 1325 of FIG. 13E following epitaxial growth. One of the trenches may first be recessed further than the other of the trenches. In an embodiment, the contacts are formed from a metallic species. In one such embodiment, the metallic species is formed by conformally depositing a contact metal and then filling any remaining trench volume. The conformal aspect of the deposition may be performed by using chemical vapor deposition (CVD), atomic layer deposition (ALD), or metal reflow.

In an embodiment, as described throughout, an integrated circuit structure includes non-planar devices such as, but not limited to, a finFET or a tri-gate device with corresponding one or more overlying nanowire structures. In such an embodiment, a corresponding semiconducting channel region is composed of or is formed in a three-dimensional body with one or more discrete nanowire channel portions overlying the three-dimensional body. In one such embodiment, the gate structures surround at least a top surface and a pair of sidewalls of the three-dimensional body, and further surrounds each of the one or more discrete nanowire channel portions.

In an embodiment, as described throughout, a substrate may be composed of a semiconductor material that can withstand a manufacturing process and in which charge can migrate. In an embodiment, the substrate is a bulk substrate composed of a crystalline silicon, silicon/germanium or germanium layer doped with a charge carrier, such as but not limited to phosphorus, arsenic, boron or a combination thereof, to form an active region. In one embodiment, the concentration of silicon atoms in a bulk substrate is greater than 97%. In another embodiment, a bulk substrate is composed of an epitaxial layer grown atop a distinct crystalline substrate, e.g. a silicon epitaxial layer grown atop a boron-doped bulk silicon mono-crystalline substrate. A bulk substrate may alternatively be composed of a group III-V material. In an embodiment, a bulk substrate is composed of a III-V material such as, but not limited to, gallium nitride, gallium phosphide, gallium arsenide, indium phosphide, indium antimonide, indium gallium arsenide, aluminum gallium arsenide, indium gallium phosphide, or a combination thereof. In one embodiment, a bulk substrate is composed of a III-V material and the charge-carrier dopant impurity atoms are ones such as, but not limited to, carbon, silicon, germanium, oxygen, sulfur, selenium or tellurium.

In an embodiment, as described throughout, a trench isolation layer may be composed of a material suitable to ultimately electrically isolate, or contribute to the isolation of, portions of a permanent gate structure from an underlying bulk substrate or isolate active regions formed within an underlying bulk substrate, such as isolating fin active regions. For example, in one embodiment, a trench isolation layer is composed of a dielectric material such as, but not limited to, silicon dioxide, silicon oxy-nitride, silicon nitride, or carbon-doped silicon nitride.

In an embodiment, as described throughout, self-aligned gate endcap isolation structures may be composed of a material or materials suitable to ultimately electrically isolate, or contribute to the isolation of, portions of permanent gate structures from one another. Exemplary materials or material combinations include a single material structure such as silicon dioxide, silicon oxy-nitride, silicon nitride, or carbon-doped silicon nitride. Other exemplary materials or material combinations include a multi-layer stack having lower portion silicon dioxide, silicon oxy-nitride, silicon nitride, or carbon-doped silicon nitride and an upper portion higher dielectric constant material such as hafnium oxide.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 14:
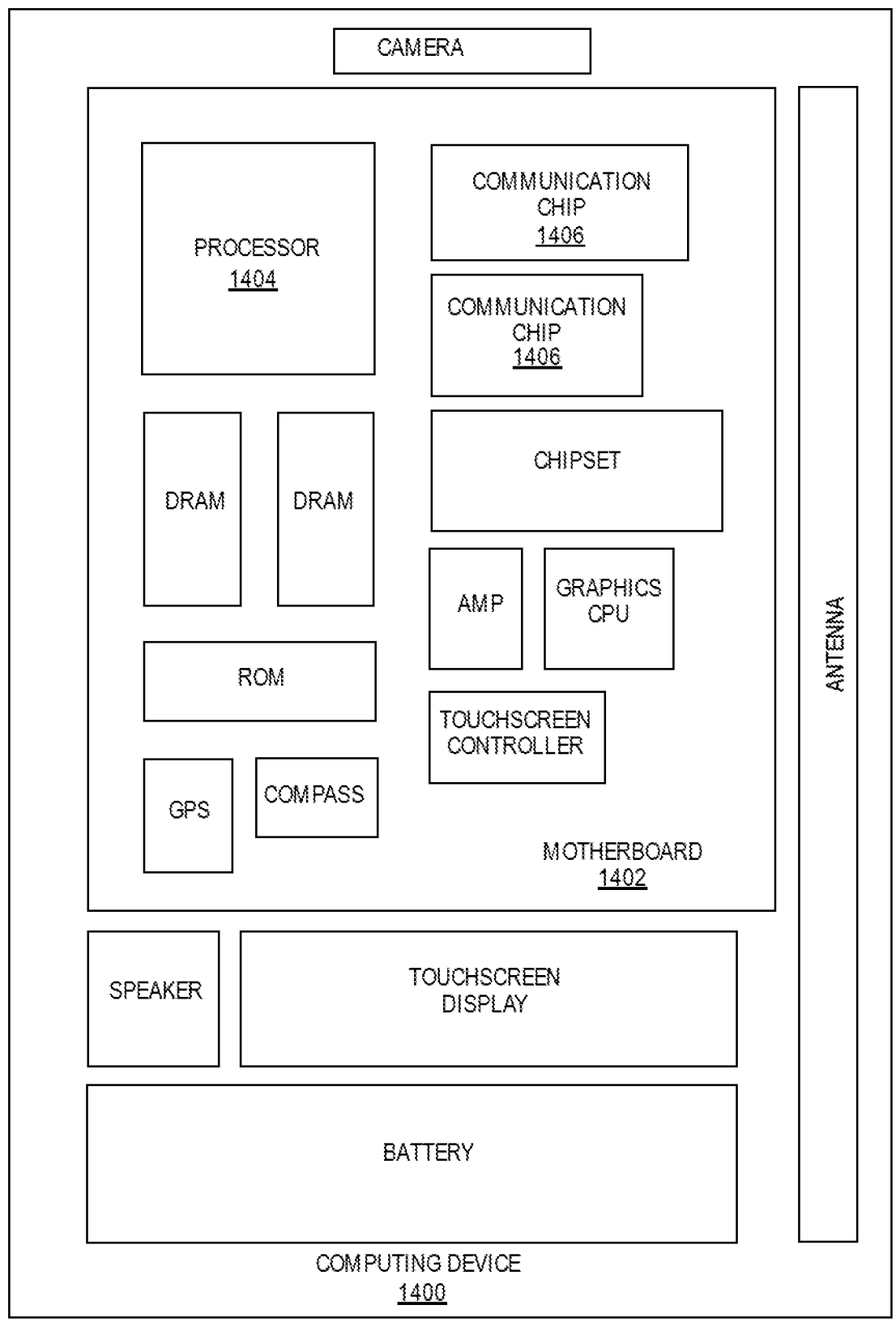
FIG. 14 illustrates a computing device in accordance with one implementation of an embodiment of the disclosure.

FIG. 14 illustrates a computing device 1400 in accordance with one implementation of an embodiment of the present disclosure. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. The integrated circuit die of the processor 1404 may include one or more structures, such as gate-all-around integrated circuit structures having high mobility built in accordance with implementations of embodiments of the present disclosure. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. The integrated circuit die of the communication chip 1406 may include one or more structures, such as gate-all-around integrated circuit structures having high mobility built in accordance with implementations of embodiments of the present disclosure.

In further implementations, another component housed within the computing device 1400 may contain an integrated circuit die that includes one or structures, such as gate-all-around integrated circuit structures having high mobility built in accordance with implementations of embodiments of the present disclosure.

In various implementations, the computing device 1400 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1400 may be any other electronic device that processes data.

Figure 15:
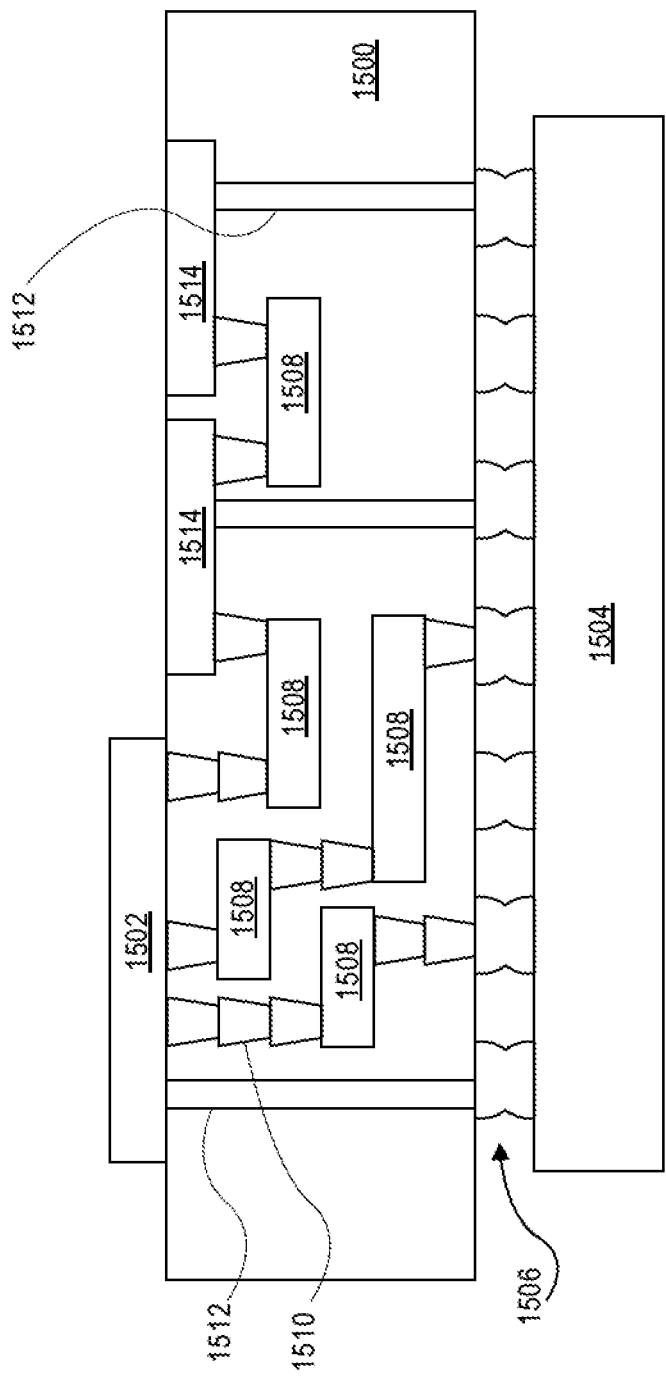
FIG. 15 illustrates an interposer that includes one or more embodiments of the disclosure.

FIG. 15 illustrates an interposer 1500 that includes one or more embodiments of the present disclosure. The interposer 1500 is an intervening substrate used to bridge a first substrate 1502 to a second substrate 1504. The first substrate 1502 may be, for instance, an integrated circuit die. The second substrate 1504 may be, for instance, a memory module, a computer motherboard, or another integrated circuit die. Generally, the purpose of an interposer 1500 is to spread a connection to a wider pitch or to reroute a connection to a different connection. For example, an interposer 1500 may couple an integrated circuit die to a ball grid array (BGA) 1506 that can subsequently be coupled to the second substrate 1504. In some embodiments, the first and second substrates 1502/1504 are attached to opposing sides of the interposer 1500. In other embodiments, the first and second substrates 1502/1504 are attached to the same side of the interposer 1500. And in further embodiments, three or more substrates are interconnected by way of the interposer 1500.

The interposer 1500 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1508 and vias 1510, including but not limited to through-silicon vias (TSVs) 1512. The interposer 1500 may further include embedded devices 1514, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1500. In accordance with embodiments of the disclosure, apparatuses or processes disclosed herein may be used in the fabrication of interposer 1500 or in the fabrication of components included in the interposer 1500.

Thus, embodiments of the present disclosure include gate-all-around integrated circuit structures having high mobility, and methods of fabricating gate-all-around integrated circuit structures having high mobility.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example embodiment 1: An integrated circuit structure includes a silicon nanowire. An N-type gate stack is around the silicon nanowire, the N-type gate stack including a compressively stressing gate electrode. A first N-type epitaxial source or drain structure is at a first end of the silicon nanowire. A second N-type epitaxial source or drain structure is at a second end of the silicon nanowire. The silicon nanowire has a <110> plane between the first N-type epitaxial source or drain structure and the second N-type epitaxial source or drain structure.

Example embodiment 2: The integrated circuit structure of example embodiment 1, wherein the N-type gate stack includes a conductive layer including a material selected from the group consisting of TiN, Cr, Al, V, Zr, and Nb.

Example embodiment 3: The integrated circuit structure of example embodiment 1 or 2, wherein first N-type epitaxial source or drain structure and the second N-type epitaxial source or drain structure include phosphorous dopant impurity atoms.

Example embodiment 4: The integrated circuit structure of example embodiment 1, 2 or 3, wherein the N-type gate stack further includes a high-k gate dielectric layer.

Example embodiment 5: An integrated circuit structure includes a vertical arrangement of silicon nanowires above a fin. An N-type gate stack is around the vertical arrangement of silicon nanowires, the N-type gate stack including a compressively stressing gate electrode. A first N-type epitaxial source or drain structure is at a first end of the vertical arrangement of silicon nanowires. A second N-type epitaxial source or drain structure is at a second end of the vertical arrangement of silicon nanowires. The vertical arrangement of silicon nanowires has a <110> plane between the first N-type epitaxial source or drain structure and the second N-type epitaxial source or drain structure.

Example embodiment 6: The integrated circuit structure of example embodiment 5, wherein the N-type gate stack includes a conductive layer including a material selected from the group consisting of TiN, Cr, Al, V, Zr, and Nb.

Example embodiment 7: The integrated circuit structure of example embodiment 5 or 6, wherein first N-type epitaxial source or drain structure and the second N-type epitaxial source or drain structure include phosphorous dopant impurity atoms.

Example embodiment 8: The integrated circuit structure of example embodiment 5, 6 or 7, further including a first conductive contact structure coupled to the first N-type epitaxial source or drain structure, and a second conductive contact structure coupled to the second N-type epitaxial source or drain structure, the second conductive contact structure deeper along the fin than the first conductive contact structure.

Example embodiment 9: The integrated circuit structure of example embodiment 8, wherein the first conductive contact structure is not along the fin.

Example embodiment 10: The integrated circuit structure of example embodiment 8, wherein the first conductive contact structure is partially along the fin.

Example embodiment 11: The integrated circuit structure of example embodiment 8, 9 or 10, wherein the second conductive contact structure is along an entirety of the fin.

Example embodiment 12: The integrated circuit structure of example embodiment 8, 9, 10 or 11, wherein the second conductive contact structure has an exposed surface at a bottom of the fin.

Example embodiment 13: The integrated circuit structure of example embodiment 8, 9, 10, 11 or 12, wherein the first and second N-type epitaxial source or drain structures are discrete first and second N-type epitaxial source or drain structures.

Example embodiment 14: The integrated circuit structure of example embodiment 8, 9, 10, 11 or 12, wherein the first and second N-type epitaxial source or drain structures are non-discrete first and second epitaxial N-type source or drain structures.

Example embodiment 15: The integrated circuit structure of example embodiment 8, 9, 10, 11, 12, 13 or 14, wherein the fin is a silicon fin.

Example embodiment 16: The integrated circuit structure of example embodiment 8, 9, 10, 11, 12, 13, 14 or 15, wherein the N-type gate stack includes a high-k gate dielectric layer.

Example embodiment 17: An integrated circuit structure includes a silicon nanoribbon. An N-type gate stack is around the silicon nanoribbon, the N-type gate stack including a compressively stressing gate electrode. A first N-type epitaxial source or drain structure is at a first end of the silicon nanoribbon. A second N-type epitaxial source or drain structure is at a second end of the silicon nanoribbon. The silicon nanoribbon has a <110> plane between the first N-type epitaxial source or drain structure and the second N-type epitaxial source or drain structure.

Example embodiment 18: The integrated circuit structure of example embodiment 17, wherein the N-type gate stack includes a conductive layer including a material selected from the group consisting of TiN, Cr, Al, V, Zr, and Nb.

Example embodiment 19: The integrated circuit structure of example embodiment 17 or 18, wherein first N-type epitaxial source or drain structure and the second N-type epitaxial source or drain structure include phosphorous dopant impurity atoms.

Example embodiment 20: The integrated circuit structure of example embodiment 17, 18 or 19, wherein the N-type gate stack further includes a high-k gate dielectric layer.

What is claimed is:

1. An integrated circuit structure, comprising:
   a silicon nanowire vertically over a substrate, the silicon nanowire having a top surface;
   an N-type gate stack around the silicon nanowire;
   a first N-type epitaxial source or drain structure at a first end of the silicon nanowire; and
   a second N-type epitaxial source or drain structure at a second end of the silicon nanowire, wherein the top surface of the silicon nanowire has a <110> plane between the first N-type epitaxial source or drain structure and the second N-type epitaxial source or drain structure.

2. The integrated circuit structure of claim 1, wherein the N-type gate stack comprises a conductive layer comprising a material selected from the group consisting of TiN, Cr, Al, V, Zr, and Nb.

3. The integrated circuit structure of claim 1, wherein first N-type epitaxial source or drain structure and the second N-type epitaxial source or drain structure comprise phosphorous dopant impurity atoms.

4. The integrated circuit structure of claim 1, wherein the N-type gate stack further comprises a high-k gate dielectric layer.

5. An integrated circuit structure, comprising:
   a vertical arrangement of silicon nanowires vertically over a fin, each of the silicon nanowires having a top surface;
   an N-type gate stack around the vertical arrangement of silicon nanowires;
   a first N-type epitaxial source or drain structure at a first end of the vertical arrangement of silicon nanowires; and
   a second N-type epitaxial source or drain structure at a second end of the vertical arrangement of silicon nanowires, wherein the top surface of each nanowire has a <110> plane between the first N-type epitaxial source or drain structure and the second N-type epitaxial source or drain structure.

6. The integrated circuit structure of claim 5, wherein the N-type gate stack comprises a conductive layer comprising a material selected from the group consisting of TiN, Cr, Al, V, Zr, and Nb.

7. The integrated circuit structure of claim 5, wherein first N-type epitaxial source or drain structure and the second N-type epitaxial source or drain structure comprise phosphorous dopant impurity atoms.

8. The integrated circuit structure of claim 5, further comprising:
   a first conductive contact structure coupled to the first N-type epitaxial source or drain structure; and
   a second conductive contact structure coupled to the second N-type epitaxial source or drain structure, the second conductive contact structure deeper along the fin than the first conductive contact structure.

9. The integrated circuit structure of claim 8, wherein the first conductive contact structure is not along the fin.

10. The integrated circuit structure of claim 8, wherein the first conductive contact structure is partially along the fin.

11. The integrated circuit structure of claim 8, wherein the second conductive contact structure is along an entirety of the fin.

12. The integrated circuit structure of claim 8, wherein the second conductive contact structure has an exposed surface at a bottom of the fin.

13. The integrated circuit structure of claim 5, wherein the first and second N-type epitaxial source or drain structures are discrete first and second N-type epitaxial source or drain structures.

14. The integrated circuit structure of claim 5, wherein the first and second N-type epitaxial source or drain structures are non-discrete first and second epitaxial N-type source or drain structures.

15. The integrated circuit structure of claim 5, wherein the fin is a silicon fin.

16. The integrated circuit structure of claim 5, wherein the N-type gate stack comprises a high-k gate dielectric layer.

17. An integrated circuit structure, comprising:
   a silicon nanoribbon vertically over a substrate, the silicon nanoribbon having a top surface;
   an N-type gate stack around the silicon nanoribbon;
   a first N-type epitaxial source or drain structure at a first end of the silicon nanoribbon; and
   a second N-type epitaxial source or drain structure at a second end of the silicon nanoribbon, wherein the top surface of the silicon nanoribbon has a <110> plane between the first N-type epitaxial source or drain structure and the second N-type epitaxial source or drain structure.

18. The integrated circuit structure of claim 17, wherein the N-type gate stack comprises a conductive layer comprising a material selected from the group consisting of TiN, Cr, Al, V, Zr, and Nb.

19. The integrated circuit structure of claim 17, wherein first N-type epitaxial source or drain structure and the second N-type epitaxial source or drain structure comprise phosphorous dopant impurity atoms.

20. The integrated circuit structure of claim 17, wherein the N-type gate stack further comprises a high-k gate dielectric layer.

* * * * *